United States Patent
Adachi et al.

(10) Patent No.: US 9,214,259 B2
(45) Date of Patent: Dec. 15, 2015

(54) COMPOSITE LAMINATED CERAMIC ELECTRONIC COMPONENT

(71) Applicant: MURATA MANUFACTURING CO., LTD., Nagaokakyo-shi, Kyoto-Fu (JP)

(72) Inventors: Hiroshige Adachi, Nagaokakyo (JP);
Seiji Fujita, Nagaokakyo (JP);
Kazuhiro Kaneko, Nagaokakyo (JP);
Satoru Adachi, Nagaokakyo (JP);
Sadaaki Sakamoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 129 days.

(21) Appl. No.: 14/456,440

(22) Filed: Aug. 11, 2014

(65) Prior Publication Data
US 2015/0030830 A1   Jan. 29, 2015

Related U.S. Application Data

(63) Continuation of application No. PCT/JP2013/052577, filed on Feb. 5, 2013.

(30) Foreign Application Priority Data

Feb. 13, 2012  (JP) ................. 2012-028179

(51) Int. Cl.
*H01B 3/12* (2006.01)
*B32B 7/02* (2006.01)
(Continued)

(52) U.S. Cl.
CPC .. *H01B 3/12* (2013.01); *B32B 7/02* (2013.01); *B32B 18/00* (2013.01); *C04B 35/20* (2013.01);
(Continued)

(58) Field of Classification Search
CPC .... C04B 2235/3262–2235/3268; C04B 35/20; C04B 35/443; C04B 2235/3222; C04B 2235/3445; C04B 35/46; C04B 35/462; C04B 35/468; C04B 35/4682; C04B 35/4686; C04B 35/50; C04B 35/505; H01B 3/12; B32B 7/02
USPC ........................................ 428/212
See application file for complete search history.

(56) References Cited

U.S. PATENT DOCUMENTS 6,195,250 B1 * 2/2001 Matoba et al. ............. 361/321.5
6,846,767 B2 * 1/2005 Kim et al. .................... 501/136
(Continued)

FOREIGN PATENT DOCUMENTS

EP       2065346 A1 *  6/2009
JP       11-209172      8/1999
(Continued)

OTHER PUBLICATIONS

PCT/JP2013/052577 Written Opinion dated Feb. 25, 2013.

*Primary Examiner* — Aaron Austin
*Assistant Examiner* — Michael Zhang
(74) *Attorney, Agent, or Firm* — Arent Fox LLP

(57) ABSTRACT

A composite laminated ceramic electronic component that includes co-fired low dielectric-constant ceramic layers and high dielectric-constant ceramic layers. The low dielectric-constant ceramic layers and the high dielectric-constant ceramic layers are each composed of a glass ceramic containing: a first ceramic composed of $MgAl_2O_4$ and/or $Mg_2SiO_4$; a second ceramic composed of BaO, $RE_2O_3$ (where RE is a rare-earth element), and $TiO_2$; glass containing each of 44.0 to 69.0 weight % of RO (where R is an alkaline-earth metal), 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and MnO. The content ratios of the glass, etc. are varied between the low dielectric-constant ceramic layers and the high dielectric-constant ceramic layers.

12 Claims, 5 Drawing Sheets

(51) Int. Cl.
*C04B 35/20* (2006.01)
*H01G 4/30* (2006.01)
*H01G 4/12* (2006.01)
*B32B 18/00* (2006.01)
*H05K 1/02* (2006.01)
*H05K 3/46* (2006.01)
*C04B 35/462* (2006.01)
*C04B 35/478* (2006.01)
*C04B 35/626* (2006.01)
*H01G 4/10* (2006.01)
*C04B 35/443* (2006.01)

(52) U.S. Cl.
CPC ............ *C04B 35/443* (2013.01); *C04B 35/462* (2013.01); *C04B 35/478* (2013.01); *C04B 35/62685* (2013.01); *H01G 4/105* (2013.01); *H01G 4/12* (2013.01); *H01G 4/129* (2013.01); *H01G 4/1209* (2013.01); *H01G 4/1218* (2013.01); *H01G 4/30* (2013.01); *H05K 3/4629* (2013.01); *H05K 3/4688* (2013.01); *C04B 2235/3206* (2013.01); *C04B 2235/3215* (2013.01); *C04B 2235/3222* (2013.01); *C04B 2235/3225* (2013.01); *C04B 2235/3232* (2013.01); *C04B 2235/3262* (2013.01); *C04B 2235/3281* (2013.01); *C04B 2235/3445* (2013.01); *C04B 2235/3481* (2013.01); *C04B 2235/36* (2013.01); *C04B 2235/6025* (2013.01); *C04B 2235/80* (2013.01); *C04B 2237/341* (2013.01); *C04B 2237/343* (2013.01); *C04B 2237/62* (2013.01); *H05K 1/024* (2013.01); *H05K 2201/10371* (2013.01); *Y10T 428/24942* (2015.01)

(56) References Cited

U.S. PATENT DOCUMENTS

| | | | |
|---|---|---|---|
| 2002/0142187 A1 | 10/2002 | Sugimoto et al. | |
| 2003/0228968 A1 | 12/2003 | Usui et al. | |
| 2006/0287184 A1* | 12/2006 | Mori et al. | 501/32 |
| 2007/0213202 A1* | 9/2007 | Arashi et al. | 501/138 |
| 2007/0237935 A1 | 10/2007 | Mori et al. | |
| 2008/0297978 A1 | 12/2008 | Ohaga et al. | |
| 2009/0122506 A1* | 5/2009 | Sugimoto et al. | 361/811 |
| 2010/0237007 A1* | 9/2010 | Merkel et al. | 210/510.1 |
| 2010/0248927 A1 | 9/2010 | Arashi et al. | |
| 2011/0223399 A1* | 9/2011 | Adachi et al. | 428/212 |
| 2011/0223431 A1* | 9/2011 | Sakurai et al. | 428/446 |
| 2011/0242728 A1* | 10/2011 | Sakurai et al. | 361/321.1 |
| 2012/0015198 A1* | 1/2012 | Masukawa et al. | 428/446 |
| 2014/0057087 A1* | 2/2014 | Adachi et al. | 428/212 |
| 2014/0066283 A1* | 3/2014 | Kaneko et al. | 501/9 |
| 2014/0347782 A1* | 11/2014 | Fujita et al. | 361/301.4 |

FOREIGN PATENT DOCUMENTS

| | | | |
|---|---|---|---|
| JP | 2002-029827 A | | 1/2002 |
| JP | 2003-063861 A | | 3/2003 |
| JP | 2006261351 A | * | 9/2006 |
| JP | 2007-254213 A | | 10/2007 |
| JP | 2008-037739 A | | 2/2008 |
| JP | 2010-235327 A | | 10/2010 |
| WO | WO-03-040057 A1 | | 5/2003 |
| WO | WO-2007-086184 A1 | | 8/2007 |
| WO | WO-2010-058697 A1 | | 5/2010 |
| WO | WO 2012157299 A1 | * | 11/2012 |
| WO | WO 2012157300 A1 | * | 11/2012 |

* cited by examiner

COMPOSITE LAMINATED CERAMIC ELECTRONIC COMPONENT

CROSS REFERENCE TO RELATED APPLICATIONS

The present application is a continuation of International application No. PCT/JP2013/052577, filed Feb. 5, 2013, which claims priority to Japanese Patent Application No. 2012-028179, filed Feb. 13, 2012, the entire contents of each of which are incorporated herein by reference.

FIELD OF THE INVENTION

This invention relates to a laminated ceramic electronic component such as a multilayer ceramic substrate which has, for example, a microwave resonator, filter, or capacitor configured therein, and more particularly, to a composite laminated ceramic electronic component including a composite structure obtained by stacking low dielectric-constant ceramic layers with a relatively low relative permittivity and high dielectric-constant ceramic layers with a relatively high relative permittivity.

BACKGROUND OF THE INVENTION

In recent years, with a reduction in size, weight, and thickness for electronic devices, the reduction in size has been required for electronic components for use in electronic devices. However, conventionally, electronic components such as capacitors and resonators are each configured separately, and the reduction just in size for these components thus has limitations in the reduction in size for electronic devices. Consequently, various multilayer ceramic substrates have been proposed which have elements, such as capacitors and resonators, configured therein.

In addition, in order to deal with the recent trends of further reductions in size and recent higher frequencies for multilayer ceramic substrates, various multilayer ceramic substrates has been also proposed which have a composite structure in which low dielectric-constant ceramic layers and high dielectric-constant ceramic layers are stacked. For example, as described in Japanese Patent Application Laid-Open No. 2002-29827 (Patent Document 1) and Japanese Patent Application Laid-Open No. 2003-63861 (Patent Document 2), multilayer ceramic substrates have been proposed in which high dielectric-constant ceramic layers composed of a high dielectric-constant and low-dielectric-loss material, with elements such as capacitors and resonators configured therein, are placed so as to be sandwiched by low dielectric-constant ceramic layers with wiring formed and semiconductor elements mounted.

Patent Document 1 and Patent Document 2 also discloses a glass ceramic composition suitable for forming low dielectric-constant ceramic layers or a glass ceramic composition suitable for forming high dielectric-constant ceramic layers.

More specifically, Patent Document 1 discloses, in claim 1 thereof, a glass ceramic composition containing an $MgAl_2O_4$-based ceramic and glass. More particularly, a glass ceramic composition is described which contains: a $MgAl_2O_4$— based ceramic powder; and a glass powder containing 13 to 50 weight % of silicon oxide in terms of $SiO_2$, 8 to 60 weight % of boron oxide in terms of $B_2O_3$, 0 to 20 weight % of aluminum oxide in terms of $Al_2O_3$, and 10 to 55 weight % of magnesium oxide in terms of MgO.

In addition, Patent Document 1 discloses, in claim 2 thereof, an alkaline-earth metal oxide which may be further contained in a proportion of 20 weight % or less, and in claim 6 thereof, the glass content which may be preferably 20 to 80 weight % of the total.

The glass ceramic composition described in Patent Document 1 achieves, in the case of a sintered body thereof, a relatively low relative permittivity such as, for example, 8 or less, and can be thus made suitable for high-frequency applications.

Next, Patent Document 2 discloses, as a high dielectric-constant material constituting high dielectric-constant ceramic layers with a relatively high relative permittivity, a material containing a $BaO$—$TiO_2$—$RE_2O_3$ (RE is a rare-earth element) dielectric and glass. The glass contains, according to claim 2 of Patent Document 2, 10 to 25 weight % of $SiO_2$, 10 to 40 weight % of $B_2O_3$, 25 to 55 weight % of MgO, 0 to 20 weight % of ZnO, 0 to 15 weight % of $Al_2O_3$, 0.5 to 10 weight % of $Li_2O$, and 0 to 10 weight % of RO (R is at least one of Ba, Sr, and Ca). In addition, as described in claim 4 of Patent Document 2, the content of the glass is preferably 15 to 35 weight %.

On the other hand, Patent Document 2 discloses a material similar to that in Patent Document 1, as a low dielectric-constant material constituting the low dielectric-constant ceramic layers.

The inventors have first found insulation reliability to be further improved, as a result of making further experiments on the respective glass ceramic compositions described in Patent Documents 1 and 2 mentioned above. The cause is assumed as follows.

The glass contained in the glass ceramic composition described in each of Patent Documents 1 and 2 is indented to allow firing at a temperature of 1000° C. or lower, but is a composition that is likely to be crystallized. In the case of the glass ceramic compositions described in Patent Documents 1 and 2, the glass component and the ceramic component react to deposit crystals in the firing process, and it is thus difficult to stabilize the crystal quantity and the quantity of the glass component at the time of completion of firing. Further, this instability of the crystal quantity and the quantity of the glass component at the time of completion of firing is assumed to decrease the insulation reliability.

For example, the glass contained in the glass ceramic compositions described in each of Patent Documents 1 and 2 contains a relatively large amount of MgO, this large amount of MgO in the glass is believed to deposit crystals of $MgAl_2O_4$ and/or $Mg_2SiO_4$ from the glass component, and this deposition is assumed to lead to a decrease in insulation reliability.

In addition, in particular, the high dielectric-constant material described in Patent Document 2 requires the addition of glass in order to allow firing at temperatures of 1000° C. or less, and on the other hand, requires a $BaO$—$TiO_2$—$RE_2O_3$ based dielectric contained in order to increase the relative permittivity. However, free Ti ions from the $BaO$—$TiO_2$—$RE_2O_3$ based dielectric cause oxygen defects. Furthermore, these oxygen defects can cause a decrease in insulation reliability in use at, in particular, high temperature and high voltage for a long period of time, etc.

In addition, the inventors of the present application have recognized, as a result of repeated experiments, problems of the compositions of the respective glass ceramic compositions described in Patent Documents 1 and 2, such as difficulty in stably achieving desired relative permittivity in a wide range from low relative permittivity to high relative permittivity.

More specifically, the glass contained in the glass ceramic compositions described in Patent Documents 1 and 2 is likely to react with the ceramic component to be crystallized in the firing process as described previously. When the crystals are deposited, the relative permittivity will be changed, and it will be thus difficult to achieve desired relative permittivity.

In addition, the glass contained in the glass ceramic compositions described in Patent Documents 1 and 2 fails to have favorable wettability to $MgAl_2O_4$ based ceramics or BaO—$TiO_2$—$RE_2O_3$ based dielectrics. Therefore, the glass ceramic composition is not able to be sintered, unless a relatively large amount of glass is added. However, the large additive amount of glass will decrease the relative permittivity. Thus, it is difficult to prepare, in particular, high dielectric-constant materials.

Furthermore, as a specific problem with composite laminate ceramic electronic components, it has to be also considered whether the properties obtained in the case of a low dielectric-constant ceramic layer by itself and the properties obtained in the case of a high dielectric-constant ceramic layer by itself are almost maintained in the case of co-firing low dielectric-constant ceramic layers and high dielectric-constant ceramic layers. In particular, the glass contained in the glass ceramic composition described in each of Patent Documents 1 and 2 has a composition that is likely to be crystallized, and thus, from the perspective of difficulty in stabilizing the crystal quantity and the quantity of the glass component at the time of completion of firing, it is assumed that there can be also a good possibility that, as a result of co-firing the low dielectric-constant ceramic layer and the high dielectric-constant ceramic layer, the properties of the respective ceramic layers by themselves will be lost.

Patent Document 1: Japanese Patent Application Laid-Open No. 2002-29827
Patent Document 2: Japanese Patent Application Laid-Open No. 2003-63861

SUMMARY OF THE INVENTION

Therefore, an object of this invention is to provide a composite laminated ceramic electronic component which can have co-fired low dielectric-constant ceramic layers and high dielectric-constant ceramic layers, and achieve reasonable characteristics for each of the low dielectric-constant ceramic layers and high dielectric-constant ceramic layers.

This invention is directed to a composite laminated ceramic electronic component including a low dielectric-constant ceramic layer and a high dielectric-constant ceramic layer that are stacked, and characteristically configured as follows in order to solve the technical problems mentioned above.

The low dielectric-constant ceramic layer and high dielectric-constant ceramic layer each include a glass ceramic containing: (1) a first ceramic including at least one of $MgAl_2O_4$ and $Mg_2SiO_4$; (2) a second ceramic including BaO, $RE_2O_3$ (RE is a rare-earth element), and $TiO_2$; (3) glass containing each of 44.0 to 69.0 weight % of RO (R is at least one alkali-earth metal selected from Ba, Ca, and Sr), 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and (4) MnO.

Further, the low dielectric-constant ceramic layer contains 47.55 to 69.32 weight % of the first ceramic, contains 6 to 20 weight % of the glass, contains 7.5 to 18.5 weight % of MnO, and contains, as the second ceramic, each of: 0.38 to 1.43 weight % of BaO; 1.33 to 9.5 weight % of $RE_2O_3$; and 0.95 to 6.75 weight % of $TiO_2$, and has a relative permittivity of 15 or less.

On the other hand, the high dielectric-constant ceramic layer contains 15.5 to 47 weight % of the first ceramic, contains 7 to 20 weight % of the glass, contains 5.5 to 20.5 weight % of the MnO, contains, as the second ceramic, each of: 2.1 to 5.2 weight % of BaO; 13.2 to 34.75 weight % of $RE_2O_3$; and 9.5 to 24.75 weight % of $TiO_2$, and has a relative permittivity of 20 or more and 25 or less.

Preferably, the content $G_L$ of the glass contained in the low dielectric-constant ceramic layer and the content $G_H$ of the glass contained in the high dielectric-constant ceramic layer are adapted to meet the condition of $0.74 \leq G_L/G_H \leq 1.76$. As can be seen from the experimental examples described later, when this condition is met, the insulation reliability of, in particular, the low dielectric-constant ceramic layer can be improved.

Furthermore, preferably, the content $M_L$ of the MnO contained in the low dielectric-constant ceramic layer and the content $M_H$ of the MnO contained in the high dielectric-constant ceramic layer are adapted to meet the condition of $0.7 \leq M_L/M_H \leq 1.95$. As can be seen from the experimental examples described later, when this condition is met, the insulation reliability of, in particular, the high dielectric-constant ceramic layer can be improved.

More preferably, the two conditions mentioned above are both adapted to be met. Thus, as can be seen from the experimental examples described later, the insulation reliability can be further improved for both the low dielectric-constant ceramic layer and the high dielectric-constant ceramic layer.

Furthermore, the low dielectric-constant ceramic layer preferably further contains 3 to 20 weight % of a third ceramic including at least one of $Mg_2Al_4Si_5O_{18}$ and $BaAl_2Si_2O_8$. Thus, as can be seen from the experimental examples described later, warpage can be made less likely to be caused in the composite laminate ceramic electronic component.

In the case mentioned above, more preferably, the high dielectric-constant ceramic layer contains 1 to 7.5 weight % of the third ceramic, and the difference $(C_L-C_H)$ is 2.5 weight % or more between the content $C_L$ of the third ceramic contained in the low dielectric-constant ceramic layer and the content $C_H$ of the third ceramic contained in the high dielectric-constant layer. This difference can, in the composite laminated ceramic electronic component, make warpage more unlikely to be caused, and achieve high insulation reliability equivalent to that in the case of the high dielectric-constant ceramic layer or low dielectric-constant ceramic layer alone containing no third ceramic, without being affected by containing the third ceramic.

The low dielectric-constant ceramic layer may further contain 0.23 weight % or less of CuO, and the high dielectric-constant ceramic layer may further contain 1.2 weight % or less of CuO.

According to this invention, the low dielectric-constant ceramic layer and the high dielectric-constant ceramic layer can be subjected to co-sintering without any difficulty, because the low dielectric-constant ceramic layer and the high dielectric-constant ceramic layer are composed of the glass ceramic containing the common elements.

In addition, the insulation reliability can be increased, because the low dielectric-constant ceramic layer and the high dielectric-constant ceramic layer each contain therein the glass which is less likely to be crystallized, and contain MnO.

Furthermore, the low dielectric-constant ceramic layer can achieve characteristics such as a relative permittivity of 15 or less, high insulation reliability, a large value for Qf, and a temperature coefficient of capacitance (TCC) of 150 ppm/K or less in terms of absolute value.

On the other hand, the high dielectric-constant ceramic layer can achieve characteristics such as a relative permittivity of 20 or more and 25 or less, high insulation reliability, a large value for Qf, and a temperature coefficient of capacitance (TCC) of 60 ppm/K or less in terms of absolute value.

DETAILED DESCRIPTION OF THE INVENTION

Figure 1:
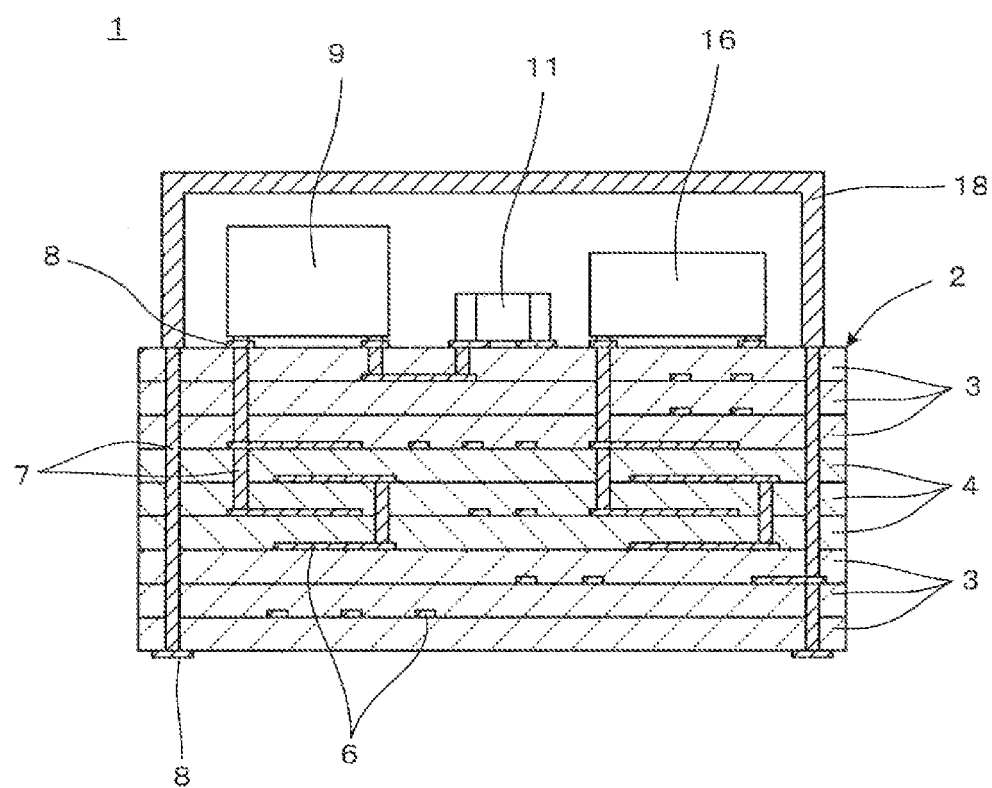
FIG. 1 is a cross-sectional view illustrating a ceramic multilayer module 1 including a multilayer ceramic substrate 2 as an example of a composite laminated ceramic electronic component according to this invention.

A ceramic multilayer module 1 including a multilayer ceramic substrate 2 as an example of a composite laminated ceramic electronic component according to this invention will be described with reference to FIGS. 1 and 2.

The multilayer ceramic substrate 2 included in the ceramic multilayer module 1 includes a plurality of low dielectric-constant ceramic layers 3 and a plurality of high dielectric-constant ceramic layers 4 that are stacked, the plurality of low dielectric-constant ceramic layers 3 is located to sandwich the plurality of high dielectric-constant ceramic layers 4, and these layers are co-fired.

The low dielectric-constant ceramic layers 3 and the high dielectric-constant ceramic layers 4 are each composed of a glass ceramic including:

(1) a first ceramic composed of at least one of $MgAl_2O_4$ and $Mg_2SiO_4$;

(2) a second ceramic composed of BaO, $RE_2O_3$ (RE is a rare-earth element), and $TiO_2$;

(3) glass containing each of 44.0 to 69.0 weight % of RO (R is at least one alkali-earth metal selected from Ba, Ca, and Sr), 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and (4) MnO.

The low dielectric-constant ceramic layers 3 and the high dielectric-constant ceramic layers 4 can be subjected to co-sintering without any difficulty, because the low dielectric-constant ceramic layers 3 and the high dielectric-constant ceramic layers 4 are composed of the glass ceramic containing the common elements as just described above.

Furthermore, the above-described glass ceramic for use in this invention achieves the following effects as will become clear from the experimental examples described later.

(A) The insulation reliability is high.

The glass contained in the glass ceramic has a composition which is less likely to be crystallized. Therefore, the crystal quantity and the glass component quantity are stabilized at the time of completion of firing, and the insulation reliability can be thus improved. This is because, as compared with the glass contained in what is described in Patent Documents 1 and 2, the glass can inhibit deposition of crystals such as $MgAl_2O_4$ and $Mg_2SiO_4$ due to the lower MgO content, and moreover, with the increased RO content, provide a composition that is not crystallized.

In addition, the glass ceramic composition contains MnO. No MnO is contained in what is described in Patent Documents 1 and 2. Ti ions produced by the reduction of the Ti oxide can cause oxygen defects, thereby causing a decrease in insulation reliability in use at high temperature and high voltage for a long period of time, etc. In this invention, the substitution of Mn for the Ti site inhibits the generation of oxygen defects. This is also assumed to contribute to improved insulation reliability.

(B) Products with a desired relative permittivity can be easily achieved over a wide range from low relative permittivity to high relative permittivity.

As described previously, the glass described in Patent Documents 1 and 2 is likely to be crystallized by reaction with the ceramic component, and thus likely to undergo a change in relative permittivity. In contrast, the glass contained in the glass ceramic for use in this invention is less likely to be crystallized, and it is thus easy to manufacture products with a desired relative permittivity.

In addition, the glass contained in the glass ceramic for use in this invention is glass that is high in wettability relative to, and low in reactivity with the first ceramic and the second ceramic. Accordingly, the glass ceramic is able to be sintered even when the glass component is reduced, and less likely to develop a reaction and stable even when the glass component is increased reversely. Therefore, it is possible to widely adjust the respective contents of the ceramic component and glass component in the glass ceramic, and thus, a wide range of products from low dielectric-constant products to high dielectric-constant products can be easily provided just by adjusting the respective contents of the ceramic component and glass component. More specifically, glass ceramics suitable for constituting the low dielectric-constant ceramic layers 3 and glass ceramics suitable for constituting the high dielectric-constant ceramic layers 4 can be provided as described below.

It is to be noted that the glass ceramic for use in this invention will not vary significantly in composition between before and after firing. Although the $B_2O_3$ and $Li_2O$ in the glass may volatilize during firing in some cases, even in those cases, the proportions of other constituents after the firing are almost unchanged from those before the firing.

The glass ceramic constituting the low dielectric-constant ceramic layers 3 contains 47.55 to 69.32 weight % of the first ceramic, contains 6 to 20 weight % of the glass, contains 7.5 to 18.5 weight % of MnO, and contains, as the second ceramic, each of: 0.38 to 1.43 weight % of BaO; 1.33 to 9.5 weight % of $RE_2O_3$; and 0.95 to 6.75 weight % of $TiO_2$.

The low dielectric-constant ceramic layers 3 can achieve characteristics such as a relative permittivity of 15 or less, high insulation reliability, a large value for Qf, and a temperature coefficient of capacitance (TCC) of 150 ppm/K or less in terms of absolute value.

On the other hand, the glass ceramic constituting the high dielectric-constant ceramic layers 4 contains 15.5 to 47 weight % of the first ceramic, contains 7 to 20 weight % of the glass, contains 5.5 to 20.5 weight % of the MnO, and contains, as the second ceramic, each of: 2.1 to 5.2 weight % of BaO; 13.2 to 34.75 weight % of $RE_2O_3$; and 9.5 to 24.75 weight % of $TiO_2$.

The high dielectric-constant ceramic layers 4 can achieve characteristics such as a relative permittivity of 20 or more and 25 or less, high insulation reliability, a large value for Qf, and a temperature coefficient of capacitance (TCC) of 60 ppm/K or less in terms of absolute value.

Preferably, the content $G_L$ of the glass contained in the low dielectric-constant ceramic layers 3 and the content $G_H$ of the glass contained in the high dielectric-constant ceramic layers 4 are adapted to meet the condition of $0.74 \leq G_L/G_H \leq 1.76$. As can be seen from the experimental examples described later, when this condition is met, the insulation reliability of, in particular, the low dielectric-constant ceramic layers 3 can be improved. This is assumed to be because interdiffusion can be inhibited between the glass component in the low dielectric-constant ceramic layers 3 and the glass component in the high dielectric-constant ceramic layers 4.

Furthermore, preferably, the content $M_L$ of the MnO contained in the low dielectric-constant ceramic layers 3 and the content $M_H$ of the MnO contained in the high dielectric-constant ceramic layers 4 are adapted to meet the condition of $0.7 \leq M_L/M_H \leq 1.95$. As can be seen from the experimental examples described later, when this condition is met, the insulation reliability of, in particular, the high dielectric-constant ceramic layers 4 can be improved. This is assumed to be because interdiffusion can be inhibited between the MnO component in the low dielectric-constant ceramic layers 3 and the MnO component in the high dielectric-constant ceramic layers 4.

More preferably, the two conditions mentioned above are both adapted to be met. Thus, as can be seen from the experimental examples described later, the insulation reliability can be further improved for both the low dielectric-constant ceramic layers 3 and the high dielectric-constant ceramic layers 4.

Furthermore, the low dielectric-constant ceramic layers 3 preferably further contain 3 to 20 weight % of a third ceramic including at least one of $Mg_2Al_4Si_5O_{18}$ and $BaAl_2Si_2O_8$. Thus, as can be seen from the experimental examples described later, warpage can be made less likely to be caused in the multilayer ceramic substrate 2.

In the case mentioned above, more preferably, the high dielectric-constant ceramic layers 4 also contain 1 to 7.5 weight % of the third ceramic, and the difference $(C_L-C_H)$ is 2.5 weight % or more between the content $C_L$ of the third ceramic contained in the low dielectric-constant ceramic layer and the content $C_H$ of the third ceramic contained in the high dielectric-constant layer. This difference can, in the multi-layer ceramic substrate 2, make warpage more unlikely to be caused, and achieve high insulation reliability equivalent to that in the case of the high dielectric-constant ceramic layers 4 alone or low dielectric-constant ceramic layers 3 alone of composition containing no third ceramic.

The low dielectric-constant ceramic layers 3 may further contain 0.23 weight % or less of CuO, and the high dielectric-constant ceramic layers 4 may further contain 1.2 weight % or less of CuO.

The multilayer ceramic substrate 2 includes various wiring conductors. The wiring conductors typically include internal conductor films 6 formed along specific interfaces between the ceramic layers 3 and 4, via hole conductors 7 extending so as to pass through specific ones of the ceramic layers 3 and 4, and external conductor films 8 formed on the outer surface of the multilayer ceramic substrate 2.

Some of the internal conductor films 6 mentioned above, which are provided in conjunction with the high dielectric-constant ceramic layers 4, are placed so as to provide electrostatic capacitance, thereby constituting capacitor elements.

The upper surface of the multilayer ceramic substrate 2 is mounted with multiple electronic components 9 to 17. Among the electronic components 9 to 17 shown, for example, the electronic component 9 is a diode, the electronic component 11 is a laminated ceramic capacitor, and the electronic component 16 is a semiconductor IC. These electronic components 9 to 17 electrically connected to specific ones of the external conductor films 8 formed on the upper surface of the multilayer ceramic substrate 2 constitute circuits required for the ceramic multilayer module 1, along with the wiring conductors formed within the multilayer ceramic substrate 2.

The upper surface of the multilayer ceramic substrate 2 has a conductive cap 18 fixed thereon for shielding the electronic components 9 to 17. The conductive cap 18 is electrically connected to specific ones of the via hole conductors 7 mentioned previously.

In addition, the ceramic multilayer module 1 is mounted on a mother board, not shown, with the use of, as connecting terminals, specific ones of the external conductor films 8 formed on the lower surface of the multilayer ceramic substrate 2.

The multilayer ceramic substrate 2 can be produced with the use of known co-firing techniques for ceramic laminates.

Specifically, first, ceramic green sheets are prepared for the low dielectric-constant ceramic layers 3. More specifically, ceramic slurry is obtained by adding an organic vehicle composed of a binder resin and a solvent to a raw material composition for providing the glass ceramic described above. This ceramic slurry is formed into the shape of a sheet by, for example, a doctor blade method, dried, and then subjected to punching into a predetermined size, thereby providing ceramic green sheets. Then, in order to form wiring conductors, these ceramic green sheets are provided with a conductive paste containing, for example, copper or silver as its main constituent in a desired pattern.

On the other hand, ceramic green sheets including a raw material composition for providing the glass ceramic constituting the high dielectric-constant ceramic layers 4 are prepared by the same method as in the case of the ceramic green sheets for the low dielectric-constant ceramic layers 3. Then, in order to form wiring conductors, these ceramic green sheets are provided with a conductive paste containing, for example, copper or silver as its main constituent in a desired pattern.

Next, the ceramic green sheets for the low dielectric-constant ceramic layers 3 and the ceramic green sheets for the high dielectric-constant ceramic layers 4, which are obtained in the way described above, are each stacked in a predetermined order for a predetermined number of layers, and then pressurized in the thickness direction.

Next, the raw stacked body obtained in the way described above is subjected to firing at a temperature of 1000° C. or lower, for example, 800 to 1000° C., thereby making it possible to provide the multilayer ceramic substrate 2. In this case, the firing is carried out in a non-oxidizing atmosphere such as a nitrogen atmosphere when the wiring conductors contain copper as their main constituent, or carried out in an oxidizing atmosphere such as the atmosphere when the conductors contain silver as their main constituent.

Next, soldering or the like is applied to mount the electronic components 9 to 17 and attach the conductive cap 18 on the surface of the multilayer ceramic substrate 2, thereby completing the ceramic multilayer module 1.

The ceramic multilayer module 1 described above can be made suitable for high-frequency applications, and excellent in reliability, because the low dielectric-constant ceramic layers 3 included in the multilayer ceramic substrate 2 have a relative permittivity of 15 or less, a large value for Qf, and a temperature coefficient of capacitance (TCC) of 150 ppm/K or less in terms of absolute value, whereas the high dielectric-constant ceramic layers 4 therein have a relative permittivity of 20 or more and 25 or less, a large value for Qf, and a temperature coefficient of capacitance (TCC) of 60 ppm/K or less in terms of absolute value. In addition, the ceramic multilayer module 1 can be improved in insulation reliability.

Next, with reference to FIGS. 3 through 5, an LC filter 21 will be described as another example of a composite laminated ceramic electronic component according to this invention.

Figure 3:
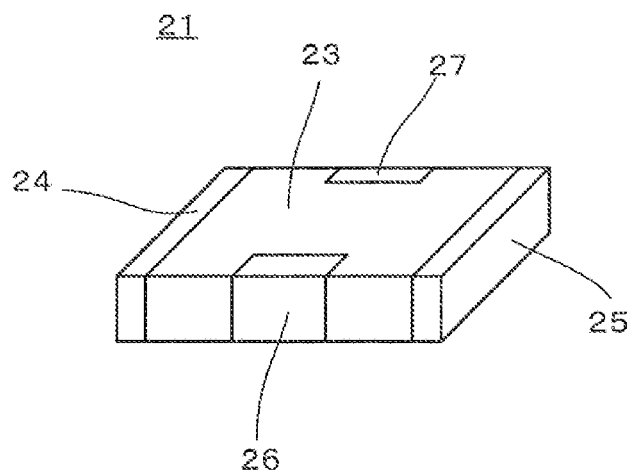
FIG. 3 is a perspective view illustrating the appearance of an LC filter 21 as another example of a composite laminated ceramic electronic component according to this invention.

The LC filter 21 includes, as shown in FIG. 3, a component main body 23 as a stacked structure in which a plurality of glass ceramic layers are stacked, respective ends on the outer surface of the component main body 23 are provided with terminal electrodes 24 and 25, and middle portions of respective side surfaces are provided with terminal electrodes 26 and 27.

Figure 4:
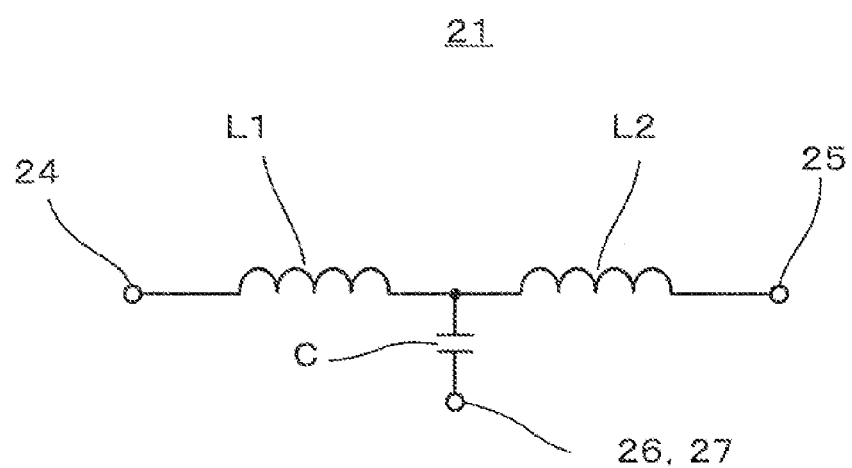
FIG. 4 is an equivalent circuit diagram given by the LC filter 21 shown in FIG. 3.

The LC filter 21 is intended to constitute, as shown in FIG. 4, two inductances L1 and L2 connected in series between the terminal electrodes 24 and 25, and constitute capacitance C between the connecting point of the inductances L1 and L2 and the terminal electrodes 26 and 27.

Figure 5:
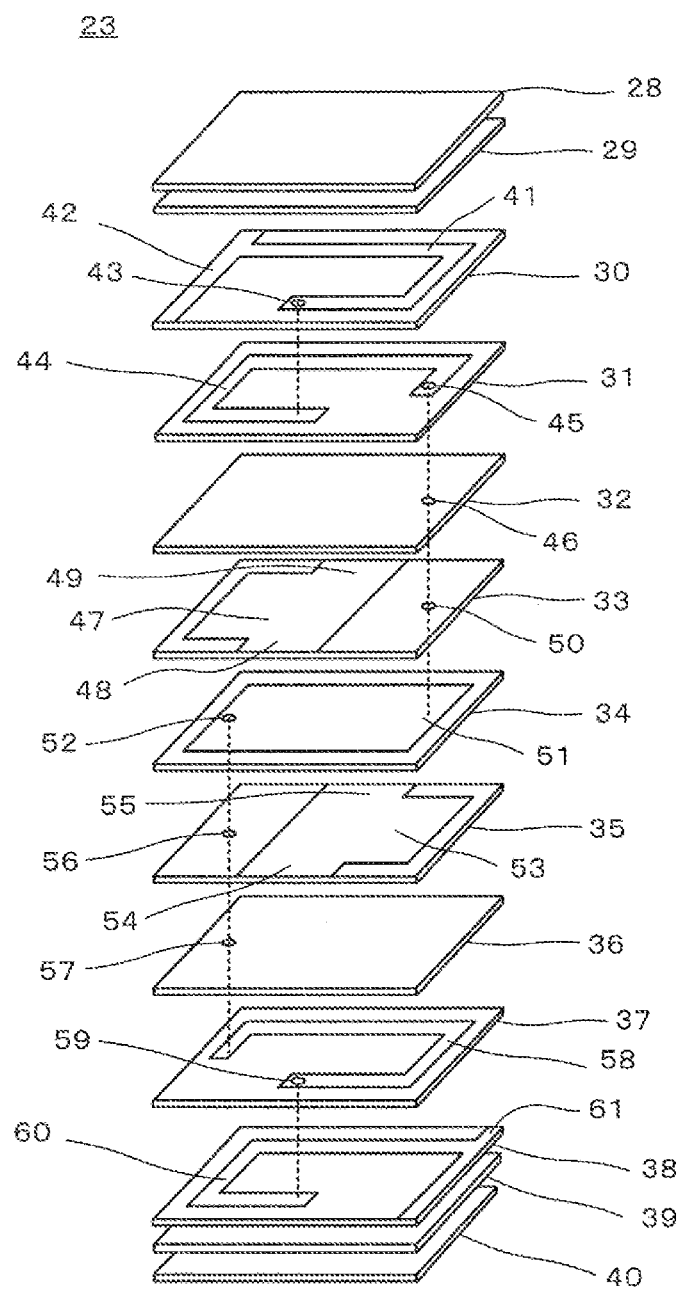
FIG. 5 is a perspective view illustrating, in an exploded form, a component main body 23 included in the LC filter 21 shown in FIG. 3.

As shown in FIG. 5, the component main body 23 includes multiple ceramic layers 28 to 40 that are stacked. It is to be noted that the number of ceramic layers that are stacked is not limited to the number shown.

The ceramic layers 28 to 40 are each obtained in such a way that an organic vehicle composed of a binder resin and a solvent is added to and mixed with a raw composition for providing the glass ceramic to obtain ceramic slurry, the ceramic slurry is formed into the shape of a sheet by a doctor blade method, dried, and then subjected to punching into a predetermined size to obtain ceramic green sheets, and the ceramic green sheets are subjected to firing.

In addition, in order to provide the inductances L1 and L2 as well as the capacitance C as shown in FIG. 4, wiring conductors are provided in the following manner, in conjunction with specific ones of the ceramic layers 28 to 40.

On the ceramic layer 30, a coil pattern 41 is formed which constitutes a part of the inductance L1, and an extraction pattern 42 is formed which extends from one end of the coil pattern 41, and the other end of the coil pattern 41 is provided with a via hole conductor 43. The extraction pattern 42 is connected to the terminal electrode 24.

On the ceramic layer 31, a coil pattern 44 is formed which constitutes a part of the inductance L1, and one end of the pattern is provided with a via hole conductor 45. The other end of the coil pattern 44 is connected to the via hole conductor 43 mentioned previously.

The ceramic layer 32 is provided with a via hole conductor 46 connected to the via hole conductor 45 mentioned above.

On the ceramic layer 33, a capacitor pattern 47 is formed which constitutes a part of the capacitance C, and extraction patterns 48 and 49 are formed which extend from the capacitor pattern 47. The extraction patterns 48 and 49 are connected to the terminal electrodes 26 and 27. In addition, the ceramic layer 33 is provided with a via hole conductor 50 connected to the via hole conductor 46 mentioned previously.

On the ceramic layer 34, a capacitor pattern 51 is formed which constitutes a part of the capacitance C, and a via hole conductor 52 is provided which is connected to the capacitor pattern 51. The capacitor pattern 51 is connected to the via hole conductor 50 mentioned previously.

On the ceramic layer 35, a capacitor pattern 53 is formed which constitutes a part of the capacitance C, and extraction patterns 54 and 55 are formed which extend from the capacitor pattern 53. The extraction patterns 54 and 55 are connected to the terminal electrodes 26 and 27. In addition, the ceramic layer 35 is provided with a via hole conductor 56 connected to the via hole conductor 52 mentioned previously.

The ceramic layer 36 is provided with a via hole conductor 57 connected to the via hole conductor 56 mentioned above.

On the ceramic layer 37, a coil pattern 58 is formed which constitutes a part of the inductance L2, and one end of the pattern is provided with a via hole conductor 59. The other end of the coil pattern 58 is connected to the via hole conductor 57 mentioned previously.

On the ceramic layer 38, a coil pattern 60 is formed which constitutes a part of the inductance L2, and an extraction pattern 61 is formed which extends from one end of the coil pattern 60. The extraction pattern 61 is connected to the terminal electrode 25. The other end of the coil pattern 60 is connected to the via hole conductor 59 mentioned previously.

For the formation of the coil patterns 41, 44, 58, and 60, extraction patterns 42, 48, 49, 54, 55, and 61, via hole conductors 43, 45, 46, 50, 52, 56, 57, and 59, as well as capacitor patters 47, 51, and 53 as wiring conductors as mentioned above, a conductive paste is used which contains, for example, copper or silver as its main constituent, and for the application of the conductive paste, for example, screen printing is applied.

Then, in order to obtain the component main body 23, the ceramic green sheets to serve as each of the ceramic layers 28 to 40 mentioned above are stacked in a predetermined order, pressurized in the thickness direction, and then subjected to firing at a temperature of 1000° C. or lower, for example, 800 to 1000° C. In this case, as in the case of the ceramic multilayer module 1 described previously, the firing is carried out in a non-oxidizing atmosphere such as a nitrogen atmosphere when the wiring conductors contain copper as their main constituent, or carried out in an oxidizing atmosphere such as the atmosphere when the conductors contain silver as its main constituent.

Furthermore, for the formation of the terminal electrodes 24 to 27 on the outer surface of the component main body 23, a thin-film formation method or the like such as vapor deposition, plating, or sputtering is applied, or application and baking with a conductive paste containing, for example, copper or silver as its main constituent, is also applied.

Figure 2:
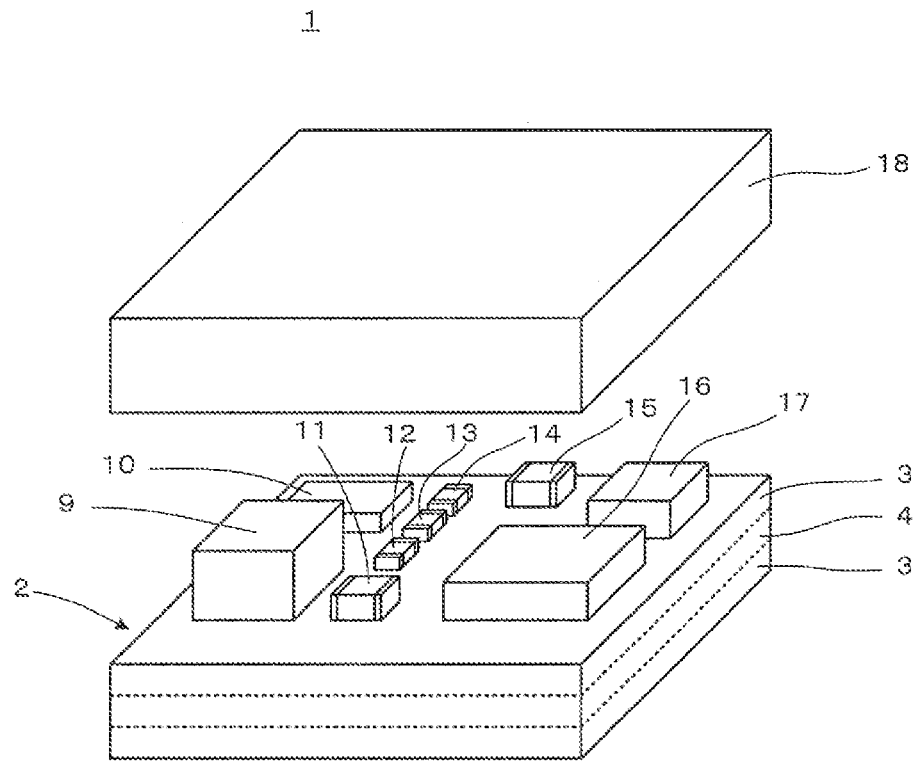
FIG. 2 is a perspective view illustrating the ceramic multilayer module 1 shown in FIG. 1 in an exploded form.

In the LC filter 21 described above, among the ceramic layers 28 to 40, the ceramic layers 33 and 34 which directly contribute to, in particular, the composition of the capacitance C are composed of the same high dielectric-constant ceramic material as that constituting the high dielectric-constant ceramic layers 4 included in the ceramic multilayer module 1 shown in FIG. 1 as described previously, whereas the other ceramic layers 28 to 32 and 35 to 40 are composed of the same low dielectric-constant ceramic material as that constituting the low dielectric-constant ceramic layers 3 included in the ceramic multilayer module 1.

This invention can be also applied to composite laminated ceramic electronic components, besides the ceramic multilayer module 1 or LC filter 21 as shown.

Next, experimental examples will be described which were implemented for evaluating characteristics achieved by the glass ceramic for use in this invention and evaluating characteristics provided by composite laminated ceramic electronic components configured with the use of the glass ceramic.

[Preparation of Glass]

First, as glass contained in the glass ceramic, and used in common in the following experimental examples, compositions prepared as shown in Table 1 were melted at a temperature of 1100 to 1400° C., vitrified by rapid cooling, and then subjected to wet grinding to prepare glass powders of various compositions.

TABLE 1

| Glass Number | Li$_2$O (weight %) | BaO (weight %) | SrO (weight %) | CaO (weight %) | MgO (weight %) | SiO$_2$ (weight %) | B$_2$O$_3$ (weight %) | Al$_2$O$_3$ (weight %) | Total of Alkali-Earth Metal (weight %) |
|---|---|---|---|---|---|---|---|---|---|
| G1 | 0.2 | 45 | 6.5 | 2.5 | 0.5 | 28.2 | 15.1 | 2 | 54 |
| G2 | 0.3 | 45 | 6.5 | 2.5 | 0.5 | 27.7 | 15.5 | 2 | 54 |
| G3 | 2 | 45 | 6.5 | 2.5 | 0.5 | 26.5 | 15 | 2 | 54 |
| G4 | 7.5 | 43.5 | 6 | 2 | 0.5 | 24 | 14.5 | 2 | 51.5 |
| G5 | 8 | 43 | 6 | 2 | 0.5 | 23.5 | 15 | 2 | 51 |
| G6 | 2.6 | 28 | 12.9 | 4 | 0.5 | 30 | 20 | 2 | 44.9 |
| G7 | 2.6 | 46.5 | 8 | 0.4 | 0.5 | 25.2 | 14.8 | 2 | 54.9 |
| G8 | 3.2 | 31.4 | 3.8 | 2.3 | 5.5 | 29.8 | 20 | 4 | 37.5 |
| G9 | 2.6 | 30 | 15 | 3.3 | 5.5 | 24.6 | 17 | 2 | 48.3 |
| G10 | 2.6 | 49 | 7.9 | 2.5 | 0.5 | 20.5 | 15 | 2 | 59.4 |
| G11 | 2.6 | 57 | 6.2 | 2.5 | 0.5 | 18.8 | 10.4 | 2 | 65.7 |
| G12 | 2.6 | 60 | 6.4 | 2.5 | 0.8 | 15 | 10.7 | 2 | 68.9 |
| G13 | 2.6 | 48.9 | 15.8 | 4.8 | 0.5 | 14.6 | 10.8 | 2 | 69.5 |
| G14 | 2.6 | 46.8 | 18.5 | 3.7 | 0.5 | 14.8 | 11.1 | 2 | 69 |
| G15 | 2.6 | 46.7 | 8.5 | 4.5 | 0.5 | 26.2 | 9 | 2 | 59.7 |
| G16 | 2.6 | 45 | 9 | 2.5 | 0.1 | 25.5 | 13.3 | 2 | 56.5 |
| G17 | 2.6 | 42 | 5.4 | 2.5 | 0.5 | 32 | 13 | 2 | 49.9 |
| G18 | 2.6 | 44.5 | 1.6 | 4.4 | 0.8 | 24.3 | 19.8 | 2 | 50.5 |
| G19 | 2.6 | 41.4 | 6.5 | 2 | 0.5 | 23.5 | 21.5 | 2 | 49.9 |
| G20 | 2.6 | 44 | 3.5 | 2.5 | 0.1 | 24.7 | 18.6 | 4 | 50 |
| G21 | 2.6 | 43.7 | 5 | 3.5 | 4 | 23.3 | 17.4 | 0.5 | 52.2 |
| G22 | 2.6 | 47 | 6.5 | 2.5 | 0.5 | 23.4 | 15 | 2.5 | 56 |
| G23 | 2.6 | 35.8 | 7.7 | 0.5 | 4 | 27.6 | 18.8 | 3 | 44 |
| G24 | 2.6 | 44.7 | 6 | 5 | 2.5 | 22 | 15 | 2.2 | 55.7 |
| G25 | 2.6 | 46.9 | 1 | 2.8 | 0.8 | 27.6 | 16.3 | 2 | 50.7 |
| G26 | 2.6 | 40.2 | 20 | 2.5 | 0.5 | 19.8 | 12.4 | 2 | 62.7 |
| G27 | 2.6 | 44.9 | 6 | 2 | 0.5 | 30 | 12 | 2 | 52.9 |
| G28 | 2.6 | 45.5 | 11.8 | 3.8 | 0.5 | 14.2 | 18.8 | 2.8 | 61.1 |
| G29 | 2.6 | 45.4 | 7.5 | 3.5 | 0.5 | 28.5 | 10 | 2 | 56.4 |
| G30 | 2.6 | 45.2 | 7.1 | 3.1 | 0.5 | 19.5 | 20 | 2 | 55.4 |
| G31 | 2.6 | 46.5 | 6.7 | 5.5 | 0.5 | 22.8 | 13.4 | 2 | 58.7 |
| G32 | 2.6 | 45 | 6.7 | 2.7 | 0 | 25.5 | 15.5 | 2 | 54.4 |
| G33 | 2.6 | 43.6 | 6.3 | 2.2 | 6.5 | 22.2 | 14.6 | 2 | 52.1 |
| G34 | 2.6 | 43.8 | 11.2 | 4.7 | 4.8 | 11.4 | 19.5 | 2 | 59.7 |
| G35 | 2.6 | 46.4 | 7.8 | 3.9 | 0.5 | 24.5 | 14 | 0.3 | 58.1 |
| G36 | 2.6 | 45 | 6.5 | 2.5 | 0.5 | 24.4 | 13.5 | 5 | 54 |

Experimental Example 1

In Experimental Example 1, evaluations were made on glass ceramics alone for low dielectric-constant ceramic layers.

First, as the first ceramic, MgCO$_3$ and Al$_2$O$_3$ were blended in predetermined proportions, and subjected to calcination and wet grinding to prepare a spinel compound: MgAl$_2$O$_4$, and MgCO$_3$ and SiO$_2$ were blended in predetermined proportions, and subjected to calcination and wet grinding to prepare a forsterite compound: Mg$_2$SiO$_4$.

Next, so as to provide the compositions shown in Tables 2 and 3, the respective powders of the glass shown in Table 1, MgAl$_2$O$_4$, Mg$_2$SiO$_4$, BaO, TiO$_2$, Nd$_2$O$_3$ and Sm$_2$O$_3$ as RE$_2$O$_3$, MnO, and CuO were blended and mixed, and an organic solvent and a binder were then added thereto to prepare slurry.

TABLE 2

| Sample Number | First Ceramic | | | | Second Ceramic (weight %) | | | | MnO (weight %) | CuO (weight %) |
|---|---|---|---|---|---|---|---|---|---|---|
| | Glass Number | (weight %) | MgAl$_2$O$_4$ | Mg$_2$SiO$_4$ | BaO | TiO$_2$ | Nd$_2$O$_3$ | Sm$_2$O$_3$ | | |
| 1 | G1 | 13 | 0 | 61.92 | 0.8 | 3.8 | 5.4 | 0 | 15 | 0.08 |
| 2 | G1 | 13 | 61.92 | 0 | 0.8 | 3.8 | 5.4 | 0 | 15 | 0.08 |
| 3 | G2 | 13 | 0 | 61.92 | 0.8 | 3.8 | 5.4 | 0 | 15 | 0.08 |
| 4 | G3 | 13 | 0 | 61.92 | 0.8 | 3.8 | 5.4 | 0 | 15 | 0.08 |
| 5 | G4 | 13 | 0 | 61.92 | 0.8 | 3.8 | 5.4 | 0 | 15 | 0.08 |
| 6 | G5 | 13 | 0 | 61.92 | 0.8 | 3.8 | 5.4 | 0 | 15 | 0.08 |
| 7 | G5 | 13 | 61.92 | 0 | 0.8 | 3.8 | 5.4 | 0 | 15 | 0.08 |
| 8 | G6 | 13 | 0 | 61.92 | 0.8 | 3.8 | 5.4 | 0 | 15 | 0.08 |
| 9 | G6 | 13 | 61.92 | 0 | 0.8 | 3.8 | 5.4 | 0 | 15 | 0.08 |
| 10 | G7 | 13 | 0 | 61.92 | 0.8 | 3.8 | 5.4 | 0 | 15 | 0.08 |
| 11 | G8 | 13 | 0 | 61.92 | 0.8 | 3.8 | 5.4 | 0 | 15 | 0.08 |
| 12 | G8 | 13 | 61.92 | 0 | 0.8 | 3.8 | 5.4 | 0 | 15 | 0.08 |
| 13 | G9 | 13 | 0 | 61.92 | 0.8 | 3.8 | 5.4 | 0 | 15 | 0.08 |
| 14 | G9 | 13 | 61.92 | 0 | 0.8 | 3.8 | 5.4 | 0 | 15 | 0.08 |
| 15 | G10 | 13 | 0 | 61.92 | 0.8 | 3.8 | 5.4 | 0 | 15 | 0.08 |
| 16 | G11 | 13 | 0 | 61.92 | 0.8 | 3.8 | 5.4 | 0 | 15 | 0.08 |

TABLE 2-continued

| Sample Number | Glass Number | Glass (weight %) | First Ceramic (weight %) | | Second Ceramic (weight %) | | | | MnO (weight %) | CuO (weight %) |
|---|---|---|---|---|---|---|---|---|---|---|
| | | | MgAl$_2$O$_4$ | Mg$_2$SiO$_4$ | BaO | TiO$_2$ | Nd$_2$O$_3$ | Sm$_2$O$_3$ | | |
| 17 | G12 | 13 | 0 | 61.92 | 0.8 | 3.8 | 5.4 | 0 | 15 | 0.08 |
| 18 | G13 | 13 | 0 | 61.92 | 0.8 | 3.8 | 5.4 | 0 | 15 | 0.08 |
| 19 | G14 | 13 | 0 | 61.92 | 0.8 | 3.8 | 5.4 | 0 | 15 | 0.08 |
| 20 | G15 | 13 | 0 | 61.92 | 0.8 | 3.8 | 5.4 | 0 | 15 | 0.08 |
| 21 | G16 | 13 | 0 | 61.92 | 0.8 | 3.8 | 5.4 | 0 | 15 | 0.08 |
| 22 | G17 | 13 | 0 | 61.92 | 0.8 | 3.8 | 5.4 | 0 | 15 | 0.08 |
| 23 | G18 | 13 | 0 | 61.92 | 0.8 | 3.8 | 5.4 | 0 | 15 | 0.08 |
| 24 | G19 | 13 | 0 | 61.92 | 0.8 | 3.8 | 5.4 | 0 | 15 | 0.08 |
| 25 | G20 | 13 | 0 | 61.92 | 0.8 | 3.8 | 5.4 | 0 | 15 | 0.08 |
| 26 | G21 | 13 | 0 | 61.92 | 0.8 | 3.8 | 5.4 | 0 | 15 | 0.08 |
| 27 | G22 | 13 | 0 | 61.92 | 0.8 | 3.8 | 5.4 | 0 | 15 | 0.08 |
| 28 | G22 | 13 | 61.92 | 61.92 | 0.8 | 3.8 | 5.4 | 0 | 15 | 0.08 |
| 29 | G23 | 13 | 0 | 0 | 0.8 | 3.8 | 5.4 | 0 | 15 | 0.08 |
| 30 | G23 | 13 | 61.92 | 61.92 | 0.8 | 3.8 | 5.4 | 0 | 15 | 0.08 |
| 31 | G24 | 13 | 0 | 0 | 0.8 | 3.8 | 5.4 | 0 | 15 | 0.08 |
| 32 | G25 | 13 | 0 | 61.92 | 0.8 | 3.8 | 5.4 | 0 | 15 | 0.08 |
| 33 | G26 | 13 | 0 | 61.92 | 0.8 | 3.8 | 5.4 | 0 | 15 | 0.08 |
| 34 | G27 | 13 | 0 | 61.92 | 0.8 | 3.8 | 5.4 | 0 | 15 | 0.08 |
| 35 | G28 | 13 | 0 | 61.92 | 0.8 | 3.8 | 5.4 | 0 | 15 | 0.08 |
| 36 | G29 | 13 | 0 | 61.92 | 0.8 | 3.8 | 5.4 | 0 | 15 | 0.08 |
| 37 | G30 | 13 | 0 | 61.92 | 0.8 | 3.8 | 5.4 | 0 | 15 | 0.08 |
| 38 | G31 | 13 | 0 | 61.92 | 0.8 | 3.8 | 5.4 | 0 | 15 | 0.08 |
| 39 | G32 | 13 | 0 | 61.92 | 0.8 | 3.8 | 5.4 | 0 | 15 | 0.08 |
| 40 | G32 | 13 | 61.92 | 0 | 0.8 | 3.8 | 5.4 | 0 | 15 | 0.08 |
| 41 | G33 | 13 | 0 | 61.92 | 0.8 | 3.8 | 5.4 | 0 | 15 | 0.08 |
| 42 | G33 | 13 | 61.92 | 0 | 0.8 | 3.8 | 5.4 | 0 | 15 | 0.08 |
| 43 | G34 | 13 | 0 | 61.92 | 0.8 | 3.8 | 5.4 | 0 | 15 | 0.08 |
| 44 | G34 | 13 | 61.92 | 0 | 0.8 | 3.8 | 5.4 | 0 | 15 | 0.08 |
| 45 | G35 | 13 | 0 | 61.92 | 0.8 | 3.8 | 5.4 | 0 | 15 | 0.08 |
| 46 | G35 | 13 | 61.92 | 0 | 0.8 | 3.8 | 5.4 | 0 | 15 | 0.08 |
| 47 | G36 | 13 | 0 | 61.92 | 0.8 | 3.8 | 5.4 | 0 | 15 | 0.08 |
| 48 | G36 | 13 | 61.92 | 0 | 0.8 | 3.8 | 5.4 | 0 | 15 | 0.08 |

TABLE 3

| Sample Number | Glass Number | Glass (weight %) | First Ceramic (weight %) | | Second Ceramic (weight %) | | | | MnO (weight %) | CuO (weight %) |
|---|---|---|---|---|---|---|---|---|---|---|
| | | | MgAl$_2$O$_4$ | Mg$_2$SiO$_4$ | BaO | TiO$_2$ | Nd$_2$O$_3$ | Sm$_2$O$_3$ | | |
| 49 | G22 | 15 | 0 | 64.92 | 0.35 | 1.9 | 2.75 | 0 | 15 | 0.08 |
| 50 | G22 | 17 | 0 | 68.12 | 0.8 | 3.5 | 6 | 0 | 4.5 | 0.08 |
| 51 | G22 | 12 | 0 | 69.32 | 0.38 | 2 | 2.75 | 0 | 13.5 | 0.05 |
| 52 | G22 | 15 | 0 | 64.4 | 0.6 | 3.5 | 4.5 | 0 | 12 | 0 |
| 53 | G22 | 15 | 63.45 | 0 | 0.75 | 3.5 | 5.25 | 0 | 12 | 0.05 |
| 54 | G22 | 5 | 0 | 59.42 | 1.4 | 6.6 | 9.5 | 0 | 18 | 0.08 |
| 55 | G22 | 12 | 0 | 60.42 | 1.4 | 6.6 | 9.5 | 0 | 10 | 0.08 |
| 56 | G22 | 12 | 52.75 | 14.4 | 0.75 | 3.45 | 4.55 | 0 | 12 | 0.1 |
| 57 | G22 | 12 | 0 | 69.55 | 0.52 | 2.63 | 4.27 | 0 | 11 | 0.03 |
| 58 | G22 | 15.5 | 0 | 63.5 | 0.4 | 0.9 | 1.5 | 0 | 18 | 0.2 |
| 59 | G22 | 13 | 0 | 61.92 | 0.8 | 3.8 | 5.4 | 0 | 15 | 0.08 |
| 60 | G22 | 10 | 0 | 62.13 | 1.42 | 6.75 | 9.5 | 0 | 10 | 0.2 |
| 61 | G22 | 19 | 0 | 63.24 | 0.4 | 0.95 | 1.33 | 0 | 15 | 0.08 |
| 62 | G22 | 20 | 0 | 57.17 | 0.4 | 1.8 | 2.6 | 0 | 18 | 0.03 |
| 63 | G22 | 13 | 61.92 | 0 | 0.8 | 3.8 | 5.4 | 0 | 15 | 0.08 |
| 64 | G22 | 6 | 0 | 61.55 | 1.4 | 6.5 | 9.5 | 0 | 15 | 0.05 |
| 65 | G22 | 14 | 0 | 68.42 | 0.8 | 3.8 | 0 | 5.4 | 7.5 | 0.08 |
| 66 | G22 | 13 | 0 | 61.92 | 0.8 | 3.8 | 0 | 5.4 | 15 | 0.08 |
| 67 | G22 | 14 | 60.92 | 0 | 0.8 | 3.8 | 0 | 5.4 | 15 | 0.08 |
| 68 | G22 | 17 | 0 | 47.55 | 1.405 | 6.575 | 9.265 | 0 | 18 | 0.205 |
| 69 | G22 | 12.5 | 0 | 61.705 | 1.415 | 6.7 | 10 | 0 | 7.5 | 0.18 |
| 70 | G22 | 12.5 | 0 | 60.32 | 1.43 | 6.7 | 9.45 | 0 | 9.5 | 0.1 |
| 71 | G22 | 15.5 | 0 | 60.15 | 1.2 | 5.65 | 7.77 | 0 | 9.5 | 0.23 |
| 72 | G22 | 11.75 | 0 | 61.87 | 1.5 | 6.7 | 9.25 | 0 | 8.85 | 0.08 |
| 73 | G22 | 20.5 | 0 | 60.37 | 0.75 | 3.35 | 4.45 | 0 | 10.5 | 0.08 |
| 74 | G22 | 10.75 | 0 | 61.38 | 1.42 | 6.75 | 0 | 9.5 | 10 | 0.2 |
| 75 | G22 | 19 | 63.24 | 0 | 0.4 | 0.95 | 0 | 1.33 | 15 | 0.08 |
| 76 | G22 | 10.5 | 0 | 60.495 | 1.425 | 6.8 | 9.45 | 0 | 11.25 | 0.08 |

TABLE 3-continued

| Sample Number | Glass Number | First Ceramic (weight %) | | | Second Ceramic (weight %) | | | | MnO (weight %) | CuO (weight %) |
|---|---|---|---|---|---|---|---|---|---|---|
| | | Glass (weight %) | MgAl$_2$O$_4$ | Mg$_2$SiO$_4$ | BaO | TiO$_2$ | Nd$_2$O$_3$ (RE$_2$O$_3$) | Sm$_2$O$_3$ (RE$_2$O$_3$) | | |
| 77 | G22 | 10 | 0 | 61.2 | 0.75 | 3.5 | 4.5 | 0 | 20 | 0.05 |
| 78 | G22 | 12 | 0 | 61.35 | 1.35 | 6.25 | 8.75 | 0 | 10 | 0.3 |
| 79 | G22 | 12.45 | 69.32 | 0 | 0.39 | 2.125 | 2.815 | 0 | 12.85 | 0.05 |
| 80 | G22 | 16.81 | 47.55 | 0 | 1.405 | 6.575 | 9.265 | 0 | 18.2 | 0.195 |
| 81 | G22 | 11.55 | 0 | 60.27 | 0.75 | 3.6 | 5.25 | 0 | 18.5 | 0.08 |
| 82 | G22 | 16.8 | 0 | 61.55 | 1.43 | 0.97 | 1.3 | 0 | 17.9 | 0.05 |
| 83 | G22 | 16.55 | 0 | 47.5 | 1.415 | 6.725 | 9.45 | 0 | 18.18 | 0.18 |
| 84 | G22 | 12 | 69.5 | 0 | 0.5 | 2.7 | 4.25 | 0 | 11 | 0.05 |
| 85 | G22 | 16.55 | 47.455 | 0 | 1.415 | 6.75 | 9.45 | 0 | 18.2 | 0.18 |
| 86 | G22 | 10.5 | 0 | 61.7 | 1.42 | 6.7 | 0 | 10 | 9.5 | 0.18 |
| 87 | G22 | 16.8 | 0 | 62.58 | 0.4 | 0.97 | 0 | 1.3 | 17.9 | 0.05 |

Next, the slurry was formed into the shape of a sheet by a doctor blade method, and dried to obtain ceramic green sheets. The ceramic green sheets were used to appropriately prepare samples, and the samples were evaluated for relative permittivity ($\epsilon_r$), Qf, temperature coefficient of capacitance ($\beta$), and insulation reliability as shown in Tables 4 and 5.

More specifically, for the measurement of the $\epsilon_r$ and Qf, the ceramic green sheets were cut, stacked, and subjected to pressure bonding to prepare pressure-bonded bodies of 0.6 mm×50 mm×50 mm in dimensions. These bodies were subjected to firing at a temperature of 990° C. to obtain ceramic substrates as the samples. These ceramic substrates were used to measure the $\epsilon_r$ and Qf by a cavity resonator method. In this case, the measurement frequency was adjusted to approximately 25 GHz.

This experimental example was intended to obtain dielectric materials with the $\epsilon_r$ of 15 or less. The samples of less than 5000 in terms of Qf were determined as rejected articles.

For the measurement of $\beta$ and the evaluation of the insulation reliability, after cutting the ceramic green sheets, a conductive paste containing Cu was printed on the ceramic green sheets in order to form internal electrodes, and thereafter, laminated ceramic capacitors as the samples were obtained through respective steps of stacking, pressure bonding, firing, and formation of external electrodes. In the laminated ceramic capacitors, the distance between adjacent internal electrodes was 10 μm, and the overlapped electrode area was 4 mm□.

Then, for the laminated ceramic capacitors, the electrostatic capacitance was measured in the range of −40° C. to 85° C. to figure out the temperature coefficient of capacitance $\beta$ with 20° C. as a standard. The samples with $\beta$ in excess of 150 ppm/K in terms of absolute value were determined as rejected articles.

Furthermore, for the laminated ceramic capacitors, the insulation resistance was measured after a test of applying DC 200 V for 100 hours under a temperature of 150° C., and the samples were determined as rejected articles when the log (IR [Ω]) after this test was less than 11, and are shown as "x" in the columns "Insulation Reliability" of Tables 4 and 5, whereas the samples were determined as accepted articles when the log (IR [Ω]) was 11 or more, and are shown as "o" in the columns "Insulation Reliability" of Tables 4 and 5.

It is to be noted that the insufficiently sintered samples are shown as "Unsintered" in the columns "Remarks" of Tables 4 and 5, and the samples with the glass unvitrified are shown as "Unvitrified" in the columns "Remarks", and these samples were not evaluated for each of $\epsilon_r$, Qf, $\beta$, and insulation reliability. In addition, rejection reasons for the samples regarded as rejected articles in this experimental example are briefly described in the columns of "Remarks".

TABLE 4

| Sample Number | $\epsilon_r$ | Qf (GHz) | $\beta$ (ppm/K) | Insulation Reliability | Remarks |
|---|---|---|---|---|---|
| 1* | — | — | — | — | Unsintered |
| 2* | — | — | — | — | Unsintered |
| 3 | 10 | 6300 | 125 | ○ | |
| 4 | 11 | 6000 | 111 | ○ | |
| 5 | 12 | 6300 | 135 | ○ | |
| 6* | 12 | 5500 | 133 | X | decreased Insulation reliability |
| 7* | 13 | 5300 | 136 | X | decreased Insulation reliability |
| 8 | 15 | 5100 | 149 | ○ | |
| 9 | 13 | 5100 | 149 | ○ | |
| 10 | 10 | 5700 | 149 | X | |
| 11* | 15 | 5300 | 672 | ○ | degraded $\beta$ |
| 12* | 13 | 5100 | 660 | ○ | degraded $\beta$ |
| 13 | 11 | 6000 | 136 | ○ | |
| 14 | 10 | 5800 | 128 | ○ | |
| 15 | — | 5300 | 112 | ○ | |
| 16 | 12 | 6600 | 121 | ○ | |
| 17 | 12 | 5100 | 128 | ○ | |
| 18* | — | — | — | — | Unsintered |
| 19 | 11 | 6100 | 128 | ○ | |
| 20* | — | — | — | — | Unsintered |
| 21 | 10 | 6000 | 126 | ○ | |
| 22* | — | — | — | — | Unsintered |
| 23 | 10 | 6000 | 122 | ○ | |
| 24* | 12 | 5200 | 133 | X | decreased Insulation reliability |
| 25 | 13 | 6400 | 132 | ○ | |
| 26 | 11 | 5400 | 112 | ○ | |
| 27 | 9 | 7900 | 112 | ○ | |
| 28 | 10 | 7800 | 114 | ○ | |
| 29 | 12 | 6400 | 133 | ○ | |
| 30 | 12 | 5500 | 139 | ○ | |
| 31 | 11 | 6800 | 122 | ○ | |
| 32 | 14 | 5400 | 149 | ○ | |
| 33 | 12 | 5100 | 128 | ○ | |
| 34 | 11 | 6100 | 114 | ○ | |
| 35 | 10 | 5400 | 121 | ○ | |
| 36 | 11 | 6000 | 128 | ○ | |
| 37 | 10 | 6000 | 133 | ○ | |
| 38 | 12 | 5600 | 149 | ○ | |
| 39* | 12 | 5500 | 870 | ○ | degraded $\beta$ |
| 40* | 12 | 5300 | 945 | ○ | degraded $\beta$ |
| 41* | 11 | 5300 | 135 | X | decreased Insulation reliability |

TABLE 4-continued

| Sample Number | εr | Qf (GHz) | β (ppm/K) | Insulation Reliability | Remarks |
|---|---|---|---|---|---|
| 42* | 15 | 5100 | 136 | X | decreased Insulation reliability |
| 43* | — | — | — | — | Unvitrified |
| 44* | — | — | — | — | Unvitrified |
| 45* | 11 | 6300 | 125 | X | decreased Insulation reliability |
| 46* | 13 | 5500 | 130 | X | decreased Insulation reliability |
| 47* | 10 | 5500 | 131 | X | decreased Insulation reliability |
| 48* | 14 | 5100 | 135 | X | decreased Insulation reliability |

TABLE 5

| Sample Number | εr | Qf (GHz) | β (ppm/K) | Insulation Reliability | Remarks |
|---|---|---|---|---|---|
| 49* | 10 | 6300 | 720 | ○ | degraded β |
| 50* | — | — | — | — | Unsintered |
| 51 | 11 | 7200 | 148 | ○ | |
| 52 | 10 | 5200 | 145 | ○ | |
| 53 | 8 | 7800 | 140 | ○ | |
| 54* | — | — | — | — | Unsintered |
| 55 | 15 | 6800 | 114 | ○ | |
| 56 | 12 | 6200 | 126 | ○ | |
| 57* | 9 | 6000 | 175 | ○ | degraded β |
| 58* | 9 | 5800 | 692 | X | degraded β |
| 59 | 9 | 8000 | 110 | ○ | |
| 60 | 15 | 7000 | 115 | ○ | |
| 61 | 8 | 6800 | 142 | ○ | |
| 62 | 9 | 5400 | 132 | ○ | |
| 63 | 11 | 5800 | 138 | ○ | |
| 64 | 14 | 6300 | 135 | ○ | |
| 65 | 13 | 5700 | 128 | ○ | |
| 66 | 9 | 6100 | 125 | ○ | |
| 67 | 12 | 5400 | 132 | ○ | |
| 68 | 13 | 5700 | 130 | ○ | |
| 69* | 12 | 6500 | 135 | X | decreased Insulation reliability |
| 70 | 12 | 6400 | 146 | ○ | |
| 71 | 9 | 5400 | 146 | ○ | |
| 72* | 12 | 6000 | 146 | X | decreased Insulation reliability |
| 73* | 10 | 6000 | 144 | X | decreased Insulation reliability |
| 74 | 12 | 7400 | 138 | ○ | |
| 75 | 10 | 5300 | 141 | ○ | |
| 76* | 12 | 5300 | 140 | X | decreased Insulation reliability |
| 77* | 11 | 5300 | 175 | ○ | degraded β |
| 78* | 12 | 5200 | 146 | X | decreased Insulation reliability |
| 79 | 9 | 7200 | 147 | ○ | |
| 80 | 13 | 5400 | 140 | ○ | |
| 81 | 9 | 6500 | 148 | ○ | |
| 82* | 9 | 6600 | 250 | ○ | degraded β |
| 83* | 14 | 4600 | 180 | ○ | decreased Qf |
| 84* | 9 | 5200 | 195 | ○ | degraded β |
| 85* | 12 | 4100 | 150 | ○ | decreased Qf |

TABLE 5-continued

| Sample Number | εr | Qf (GHz) | β (ppm/K) | Insulation Reliability | Remarks |
|---|---|---|---|---|---|
| 86* | 12 | 5500 | 140 | X | decreased Insulation reliability |
| 87* | 10 | 5200 | 285 | ○ | degraded β |

In Tables 4 and 5, the sample numbers are marked with * for the samples determined as rejected articles in this experimental example.

The following is determined from Tables 1 through 5.

First, the samples 1 to 48 shown in Tables 2 and 4 will be considered. For the samples 1 to 48, the glass G1 to G36 shown in Table 1 was all used for any of the samples. It is to be noted that the content of the "Glass" was made constant at "13 weight %" for all of the samples 1 to 48.

The samples 1 and 2 were not sufficiently sintered. This is assumed to be due to the use of the glass G1 with the $Li_2O$ content lower than 0.3 weight %.

The samples 6 and 7 underwent a decrease in insulation reliability. This is assumed to be due to the use of the glass G5 with the $Li_2O$ content higher than 7.5 weight %.

The samples 11 and 12 underwent a decrease in temperature coefficient of capacitance β. This is assumed to be due to the use of the glass G8 with the alkali-earth metal content lower than 44.0 weight %.

The sample 18 was not sufficiently sintered. This is assumed to be due to the use of the glass G13 with the alkali-earth metal content higher than 69.0 weight %.

The sample 20 was not sufficiently sintered. This is assumed to be due to the use of the glass G15 with the $B_2O_3$ content lower than 10.0 weight %.

The sample 22 was not sufficiently sintered. This is assumed to be due to the use of the glass G17 with the $SiO_2$ content higher than 30.0 weight %.

The sample 24 underwent a decrease in insulation reliability. This is assumed to be due to the use of the glass G19 with the $B_2O_3$ content higher than 20.0 weight %.

The samples 39 and 40 underwent a decrease in temperature coefficient of capacitance β. This is assumed to be due to the use of the glass G32 with the MgO content lower than 0.1 weight %.

The samples 41 and 42 underwent a decrease in insulation reliability. This is assumed to be due to the use of the glass G33 with the MgO content higher than 5.5 weight %.

The samples 43 and 44 were not vitrified. This is assumed to be due to the use of the glass G34 with the $SiO_2$ content lower than 14.2 weight %.

The samples 45 and 46 underwent a decrease in insulation reliability. This is assumed to be due to the use of the glass G35 with the $Al_2O_3$ content lower than 0.5 weight %.

The samples 47 and 48 underwent a decrease in insulation reliability. This is assumed to be due to the use of the glass G36 with the $Al_2O_3$ content higher than 4.0 weight %.

The samples 3 to 5, 8 to 10, 13 to 17, 19, 21, 23, and 25 to 38 shown in Tables 2 and 4, except for the samples 1, 2, 6, 7, 11, 12, 18, 20, 22, 24, and 39 to 48 mentioned above produced the results of Qf, β, and insulation reliability.

This is assumed to be due to the use of any glass from among G2, G3, G4, G6, G7, G9, G10, G11, G12, G14, G16, G18, G20, G21, G22, G23, G24, G25, G26, G27, G28, G29, G30, and G31 which meet the conditions of: the alkali-earth metal content from 44.0 to 69.0 weight %; the $SiO_2$ content from 14.2 to 30.0 weight %; the $B_2O_3$ content from 10.0 to 20.0 weight %; the $Al_2O_3$ content from 0.5 to 4.0 weight %;

the $Li_2O$ content from 0.3 to 7.5 weight %; and the MgO content from 0.1 to 5.5 weight %.

As for $\epsilon_r$, all of the samples shown in Tables 2 and 4, except for the samples with the evaluation results of "Unsintered" or "Unvitrified", achieved a value of 15 or less.

Next, the samples 49 to 87 shown in Tables 3 and 5 will be considered. For the samples 49 to 87, the respective contents of the "Glass", "First Ceramic", "Second Ceramic", "MnO", and "CuO" were varied while using the glass G22 shown as the "Glass" in Table 1.

The sample 49 underwent a degradation in temperature coefficient of capacitance β. This is assumed to be due to the BaO content lower than 0.38 weight % in the second ceramic.

The sample 50 was not sufficiently sintered. This is assumed to be due to the MnO content lower than 7.5 weight %.

The sample 54 was not sufficiently sintered. This is assumed to be due to the glass content lower than 6 weight %.

The sample 57 underwent a degradation in temperature coefficient of capacitance β. This is assumed to be due to the $Mg_2SiO_4$ content higher than 69.32 weight % as the first ceramic.

The sample 58 underwent a degradation in temperature coefficient of capacitance β. This is assumed to be due to the $TiO_2$ content lower than 0.95 weight % in the second ceramic.

The sample 69 underwent a decrease in insulation reliability. This is assumed to be due to the $Nd_2O_3$ content higher than 9.5 weight % as $RE_2O_3$ in the second ceramic.

The sample 72 underwent a decrease in insulation reliability. This is assumed to be due to the BaO content higher than 1.43 weight % in the second ceramic.

The sample 73 underwent a decrease in insulation reliability. This is assumed to be due to the glass content higher than 20 weight %.

The sample 76 underwent a decrease in insulation reliability. This is assumed to be due to the $TiO_2$ content higher than 6.75 weight % in the second ceramic.

The sample 77 underwent a degradation in temperature coefficient of capacitance β. This is assumed to be due to the MnO content higher than 18.5 weight %.

The sample 78 underwent a decrease in insulation reliability. This is assumed to be due to the CuO content higher than 0.23 weight %.

The sample 82 underwent a degradation in temperature coefficient of capacitance β. This is assumed to be due to the $Nd_2O_3$ content lower than 1.33 weight % as $RE_2O_3$ in the second ceramic.

The sample 83 underwent a decrease in Qf. This is assumed to be due to the $Mg_2SiO_4$ content lower than 47.55 weight % as the first ceramic.

The sample 84 underwent a degradation in temperature coefficient of capacitance β. This is assumed to be due to the $MgAl_2O_4$ content higher than 69.32 weight % as the first ceramic.

The sample 85 underwent a decrease in Qf. This is assumed to be due to the $MgAl_2O_4$ content lower than 47.55 weight % as the first ceramic.

The sample 86 underwent a decrease in insulation reliability. This is assumed to be due to the $Sm_2O_3$ content higher than 9.5 weight % as $RE_2O_3$ in the second ceramic.

The sample 87 underwent a degradation in temperature coefficient of capacitance β. This is assumed to be due to the $Sm_2O_3$ content lower than 1.33 weight % as $RE_2O_3$ in the second ceramic.

The samples 51 to 53, 55, 56, 59 to 68, 70, 71, 74, 75, and 79 to 81 shown in Tables 3 and 5, except for the samples 49, 50, 54, 57, 58, 69, 72, 73, 76 to 78, and 82 to 87 mentioned above, have achieved favorable results for Qf, β, and insulation reliability.

This is assumed to be due to the fact that the samples meet the conditions of: the first ceramic content from 47.55 to 69.32 weight %; the glass content from 6 to 20 weight %; the MnO content from 7.5 to 18.5 weight %; the BaO content from 0.38 to 1.43 weight %; the $RE_2O_3$ content from 1.33 to 9.5 weight %; the $TiO_2$ content from 0.95 to 6.75 weight %; and the CuO content of 0.23 weight % or less.

As for $\epsilon_r$, all of the samples shown in Tables 3 and 5, except for the samples with the evaluation results of "Unsintered", achieved a value of 15 or less.

It is to be noted that, while $Nd_2O_3$ and $Sm_2O_3$ were used as the $RE_2O_3$ in the second ceramic in Experimental Example 1, it has been confirmed that the same tendency is shown even in the case of using other rare-earth elements.

Experimental Example 2

In Experimental Example 2, glass ceramics for the low dielectric-constant ceramic layers were prepared as in Experimental Example 1, and in particular, influences on the low dielectric-constant glass ceramics, by the addition of a third ceramic including at least one of $Mg_2Al_4Si_5O_{18}$ and $BaAl_2Si_2O_8$, were examined.

Respective powders of spinel compound: $MgAl_2O_4$ and forsterite compound: $Mg_2SiO_4$, BaO, $TiO_2$, $Nd_2O_3$ as $RE_2O_3$, MnO, as well as CuO were prepared as in the case of Experimental Example 1.

Furthermore, in this Experimental Example 2, as shown in Table 6, $MgCO_3$, $Al_2O_3$, and $SiO_2$ were blended in predetermined proportions, and subjected to calcination and wet grinding to prepare a powder of cordierite compound: $Mg_2Al_4Si_5O_{18}$ as the third ceramic. Furthermore, likewise, as shown in Table 6, $BaCO_3$, $Al_2O_3$, and SiO2 were blended in predetermined proportions, and subjected to calcination, and wet grinding to prepare a powder of celsian compound: $BaAl_2Si_2O_3$ as the third ceramic.

Next, respective powders of the glass shown in Table 1, $MgAl_2O_4$, $Mg_2SiO_4$, BaO, $TiO_2$, $Nd_2O_3$, MnO, CuO, $Mg_2Al_4Si_5O_{18}$, and $BaAl_2Si_2O_8$ were blended so as to provide the compositions shown in Table 6. Then, these powders were mixed, and an organic solvent and a binder were then added to the mixed powders to prepare slurry.

TABLE 6

| Sample Number | Glass Number | Glass (weight %) | First Ceramic (weight %) | | Second Ceramic (weight %) | | | MnO (weight %) | CuO (weight %) | Third Ceramic (weight %) | |
|---|---|---|---|---|---|---|---|---|---|---|---|
| | | | $MgAl_2O_4$ | $Mg_2SiO_4$ | BaO | $TiO_2$ | $Nd_2O_3$ | | | $Mg_2Al_4Si_5O_{18}$ | $BaAl_2Si_2O_8$ |
| 101 | G22 | 10 | 0 | 68.92 | 0.8 | 3.8 | 5.4 | 11 | 0.08 | 0 | 0 |
| 102 | G22 | 10 | 0 | 48.92 | 0.8 | 3.8 | 5.4 | 11 | 0.08 | 10 | 10 |
| 103 | G3 | 10 | 0 | 66.92 | 0.8 | 3.8 | 5.4 | 11 | 0.08 | 2 | 0 |
| 104 | G10 | 10 | 0 | 65.92 | 0.8 | 3.8 | 5.4 | 11 | 0.08 | 3 | 0 |
| 105 | G18 | 10 | 0 | 58.92 | 0.8 | 3.8 | 5.4 | 11 | 0.08 | 10 | 0 |

TABLE 6-continued

| Sample Number | Glass Number | (weight %) | First Ceramic (weight %) | | Second Ceramic (weight %) | | | MnO (weight %) | CuO (weight %) | Third Ceramic (weight %) | |
|---|---|---|---|---|---|---|---|---|---|---|---|
| | | | $MgAl_2O_4$ | $Mg_2SiO_4$ | BaO | $TiO_2$ | $Nd_2O_3$ | | | $Mg_2Al_4Si_5O_{18}$ | $BaAl_2Si_2O_8$ |
| 106 | G22 | 10 | 0 | 48.92 | 0.8 | 3.8 | 5.4 | 11 | 0.08 | 20 | 0 |
| 107 | G24 | 10 | 0 | 47.92 | 0.8 | 3.8 | 5.4 | 11 | 0.08 | 21 | 0 |
| 108 | G3 | 10 | 0 | 66.92 | 0.8 | 3.8 | 5.4 | 11 | 0.08 | 0 | 2 |
| 109 | G10 | 10 | 0 | 65.92 | 0.8 | 3.8 | 5.4 | 11 | 0.08 | 0 | 3 |
| 110 | G18 | 10 | 0 | 58.92 | 0.8 | 3.8 | 5.4 | 11 | 0.08 | 0 | 10 |
| 111 | G22 | 10 | 0 | 48.92 | 0.8 | 3.8 | 5.4 | 11 | 0.08 | 0 | 20 |
| 112 | G24 | 10 | 0 | 47.92 | 0.8 | 3.8 | 5.4 | 11 | 0.08 | 0 | 21 |
| 113 | G16 | 10 | 0 | 58.92 | 0.8 | 3.8 | 5.4 | 11 | 0.08 | 6 | 4 |

Thereafter, in the same manner as in the case of Experimental Example 1, samples were prepared, and evaluated for relative permittivity ($\epsilon_r$), Qf, temperature coefficient of capacitance ($\beta$), insulation reliability as shown in Table 7. This experimental example was intended to obtain dielectric materials with lower $\epsilon_r$, such as $\epsilon_r$ of 8 or less.

TABLE 7

| Sample Number | $\epsilon r$ | Qf (GHz) | $\beta$ (ppm/K) | Insulation Reliability |
|---|---|---|---|---|
| 101 | 9 | 6500 | 100 | ◯ |
| 102 | 6 | 8678 | 74 | ◯ |
| 103 | 9 | 6915 | 93 | ◯ |
| 104 | 8 | 7186 | 72 | ◯ |
| 105 | 7 | 7322 | 64 | ◯ |
| 106 | 6 | 6915 | 62 | ◯ |
| 107 | 6 | 5559 | 54 | ◯ |
| 108 | 9 | 6915 | 85 | ◯ |
| 109 | 8 | 6915 | 72 | ◯ |
| 110 | 8 | 7186 | 66 | ◯ |
| 111 | 7 | 7322 | 64 | ◯ |
| 112 | 7 | 5288 | 54 | ◯ |
| 113 | 7 | 7186 | 67 | ◯ |

The following is determined from Tables 6 and 7.

In comparison between the samples 102, 104 to 107, and 109 to 113 containing 3 weight % or more of the third ceramic including at least one of $Mg_2Al_4Si_5O_{18}$ and $BaAl_2Si_2O_8$, and the samples 101, 103, and 108 containing none of them, the former has achieved lower $\epsilon_r$, such as 8 or less, and also achieved lower values for the temperature coefficient of capacitance $\beta$.

On the other hand, in the case of the samples 107 and 112 containing more than 20 weight % of the third ceramic including at least one of $Mg_2Al_4Si_5O_{18}$ and $BaAl_2Si_2O_8$, decreases in Qf were observed.

Experimental Example 3

In Experimental Example 3, evaluations were made on glass ceramics themselves for high dielectric-constant ceramic layers.

In the same manner as in the case of Experimental Example 1, prepared were respective powders of: a spinel compound: $MgAl_2O_4$ and a forsterite compound: $Mg_2SiO_4$ as the first ceramic; BaO and $TiO_2$ as the second ceramic; $Nd_2O_3$ and $Sm_2O_3$ as $RE_2O_3$; MnO; as well as CuO. Furthermore, in the same manner as in the case of Experimental Example 2, a powder of cordierite compound: $Mg_2Al_4Si_5O_{18}$ and a powder of celsian compound: $BaAl_2Si_2O_8$ were prepared as the third ceramic.

Next, for the compositions shown in Tables 8 through 10, the respective powders of the glass shown in Table 1, $MgAl_2O_4$, $Mg_2SiO_4$, BaO, $TiO_2$, $Nd_2O_3$ and $Sm_2O_3$ as $RE_2O_3$, MnO, CuO, $Mg_2Al_4Si_5O_{18}$, and $BaAl_2Si_2O_8$ were blended, and mixed, and an organic solvent and a binder were then added thereto to prepare slurry.

TABLE 8

| Sample Number | Glass Number | (weight %) | First Ceramic (weight %) | | Second Ceramic (weight %) | | | MnO (weight %) | CuO (weight %) |
|---|---|---|---|---|---|---|---|---|---|
| | | | $MgAl_2O_4$ | $Mg_2SiO_4$ | BaO (weight %) | $TiO_2$ (weight %) | $Nd_2O_3$ (weight %) | | |
| 201 | G1 | 11.1 | 0 | 28.75 | 3.95 | 18.75 | 26.6 | 10.75 | 0.1 |
| 202 | G1 | 11.5 | 27.5 | 0 | 4.05 | 19.15 | 26.85 | 10.85 | 0.1 |
| 203 | G2 | 11.1 | 0 | 28.75 | 3.95 | 18.75 | 26.6 | 10.75 | 0.1 |
| 204 | G3 | 11.1 | 0 | 28.75 | 3.95 | 18.75 | 26.6 | 10.75 | 0.1 |
| 205 | G4 | 11.1 | 0 | 28.75 | 3.95 | 18.75 | 26.6 | 10.75 | 0.1 |
| 206 | G5 | 11.1 | 0 | 28.75 | 3.95 | 18.75 | 26.6 | 10.75 | 0.1 |
| 207 | G5 | 11.5 | 27.5 | 0 | 4.05 | 19.15 | 26.85 | 10.85 | 0.1 |
| 208 | G6 | 11.1 | 0 | 28.75 | 3.95 | 18.75 | 26.6 | 10.75 | 0.1 |
| 209 | G6 | 11.5 | 27.5 | 0 | 4.05 | 19.15 | 26.85 | 10.85 | 0.1 |
| 210 | G7 | 11.1 | 0 | 28.75 | 3.95 | 18.75 | 26.6 | 10.75 | 0.1 |
| 211 | G8 | 11.1 | 0 | 28.75 | 3.95 | 18.75 | 26.6 | 10.75 | 0.1 |
| 212 | G8 | 11.5 | 27.5 | 0 | 4.05 | 19.15 | 26.85 | 10.85 | 0.1 |
| 213 | G9 | 11.1 | 0 | 28.75 | 3.95 | 18.75 | 26.6 | 10.75 | 0.1 |
| 214 | G9 | 11.5 | 27.5 | 0 | 4.05 | 19.15 | 26.85 | 10.85 | 0.1 |
| 215 | G10 | 11.1 | 0 | 28.75 | 3.95 | 18.75 | 26.6 | 10.75 | 0.1 |
| 216 | G11 | 11.1 | 0 | 28.75 | 3.95 | 18.75 | 26.6 | 10.75 | 0.1 |
| 217 | G12 | 11.1 | 0 | 28.75 | 3.95 | 18.75 | 26.6 | 10.75 | 0.1 |
| 218 | G13 | 11.1 | 0 | 28.75 | 3.95 | 18.75 | 26.6 | 10.75 | 0.1 |
| 219 | G14 | 11.1 | 0 | 28.75 | 3.95 | 18.75 | 26.6 | 10.75 | 0.1 |

TABLE 8-continued

| Sample Number | Glass Number | First Ceramic (weight %) | | Second Ceramic (weight %) | | | MnO (weight %) | CuO (weight %) |
|---|---|---|---|---|---|---|---|---|
| | | MgAl$_2$O$_4$ | Mg$_2$SiO$_4$ | BaO (weight %) | TiO$_2$ (weight %) | Nd$_2$O$_3$ (weight %) | | |
| 220 | G15 | 11.1 | 0 | 28.75 | 3.95 | 18.75 | 26.6 | 10.75 | 0.1 |
| 221 | G16 | 11.1 | 0 | 28.75 | 3.95 | 18.75 | 26.6 | 10.75 | 0.1 |
| 222 | G17 | 11.1 | 0 | 28.75 | 3.95 | 18.75 | 26.6 | 10.75 | 0.1 |
| 223 | G18 | 11.1 | 0 | 28.75 | 3.95 | 18.75 | 26.6 | 10.75 | 0.1 |
| 224 | G19 | 11.1 | 0 | 28.75 | 3.95 | 18.75 | 26.6 | 10.75 | 0.1 |
| 225 | G20 | 11.1 | 0 | 28.75 | 3.95 | 18.75 | 26.6 | 10.75 | 0.1 |
| 226 | G21 | 11.1 | 0 | 28.75 | 3.95 | 18.75 | 26.6 | 10.75 | 0.1 |
| 227 | G22 | 11.1 | 0 | 28.75 | 3.95 | 18.75 | 26.6 | 10.75 | 0.1 |
| 228 | G22 | 11.5 | 27.5 | 0 | 4.05 | 19.15 | 26.85 | 10.85 | 0.1 |
| 229 | G23 | 11.1 | 0 | 28.75 | 3.95 | 18.75 | 26.6 | 10.75 | 0.1 |
| 230 | G23 | 11.5 | 27.5 | 0 | 4.05 | 19.15 | 26.85 | 10.85 | 0.1 |
| 231 | G24 | 11.1 | 0 | 28.75 | 3.95 | 18.75 | 26.6 | 10.75 | 0.1 |
| 232 | G25 | 11.1 | 0 | 28.75 | 3.95 | 18.75 | 26.6 | 10.75 | 0.1 |
| 233 | G26 | 11.1 | 0 | 28.75 | 3.95 | 18.75 | 26.6 | 10.75 | 0.1 |
| 234 | G27 | 11.1 | 0 | 28.75 | 3.95 | 18.75 | 26.6 | 10.75 | 0.1 |
| 235 | G28 | 11.1 | 0 | 28.75 | 3.95 | 18.75 | 26.6 | 10.75 | 0.1 |
| 236 | G29 | 11.1 | 0 | 28.75 | 3.95 | 18.75 | 26.6 | 10.75 | 0.1 |
| 237 | G30 | 11.1 | 0 | 28.75 | 3.95 | 18.75 | 26.6 | 10.75 | 0.1 |
| 238 | G31 | 11.1 | 0 | 28.75 | 3.95 | 18.75 | 26.6 | 10.75 | 0.1 |
| 239 | G32 | 11.1 | 0 | 28.75 | 3.95 | 18.75 | 26.6 | 10.75 | 0.1 |
| 240 | G32 | 11.5 | 27.5 | 0 | 4.05 | 19.15 | 26.85 | 10.85 | 0.1 |
| 241 | G33 | 11.1 | 0 | 28.75 | 3.95 | 18.75 | 26.6 | 10.75 | 0.1 |
| 242 | G33 | 11.5 | 27.5 | 0 | 4.05 | 19.15 | 26.85 | 10.85 | 0.1 |
| 243 | G34 | 11.1 | 0 | 28.75 | 3.95 | 18.75 | 26.6 | 10.75 | 0.1 |
| 244 | G34 | 11.5 | 27.5 | 0 | 4.05 | 19.15 | 26.85 | 10.85 | 0.1 |
| 245 | G35 | 11.1 | 0 | 28.75 | 3.95 | 18.75 | 26.6 | 10.75 | 0.1 |
| 246 | G35 | 11.5 | 27.5 | 0 | 4.05 | 19.15 | 26.85 | 10.85 | 0.1 |
| 247 | G36 | 11.1 | 0 | 28.75 | 3.95 | 18.75 | 26.6 | 10.75 | 0.1 |
| 248 | G36 | 11.5 | 27.5 | 0 | 4.05 | 19.15 | 26.85 | 10.85 | 0.1 |

TABLE 9

| Sample Number | Glass Number | First Ceramic (weight %) | | Second Ceramic (weight %) | | | | RE$_2$O$_3$ (weight %) | MnO (weight %) | CuO (weight %) | Third Ceramic (weight %) | |
|---|---|---|---|---|---|---|---|---|---|---|---|---|
| | | MgAl$_2$O$_4$ | Mg$_2$SiO$_4$ | BaO | TiO$_2$ | Nd$_2$O$_3$ | Sm$_2$O$_3$ | | | | Mg$_2$Al$_4$Si$_5$O$_{18}$ | BaAl$_2$Si$_2$O$_8$ |
| 249 | G22 | 6.5 | 0 | 24.25 | 4.25 | 20.6 | 29.95 | 0 | 14.35 | 0.1 | 0 | 0 |
| 250 | G22 | 7 | 0 | 25.25 | 4.2 | 20.55 | 29.65 | 0 | 13.25 | 0.1 | 0 | 0 |
| 251 | G22 | 20 | 0 | 21.65 | 4 | 18.5 | 26.25 | 0 | 9.5 | 0.1 | 0 | 0 |
| 252 | G22 | 21 | 0 | 20.65 | 4 | 18.5 | 26.25 | 0 | 9.5 | 0.1 | 0 | 0 |
| 253 | G22 | 10.75 | 0 | 14 | 4.1 | 19.15 | 28 | 0 | 16.5 | 0.5 | 7 | 0 |
| 254 | G22 | 10.25 | 0 | 15.5 | 4.1 | 19.15 | 28 | 0 | 16.5 | 0.5 | 6 | 0 |
| 255 | G22 | 15.75 | 0 | 47 | 2.25 | 9.5 | 13.2 | 0 | 11.8 | 0.5 | 0 | 0 |
| 256 | G22 | 16 | 0 | 48 | 2.25 | 9.5 | 13.2 | 0 | 10.55 | 0.5 | 0 | 0 |
| 257 | G22 | 10.6 | 15.5 | 0 | 4.1 | 19.15 | 28 | 0 | 15.55 | 0.1 | 7 | 0 |
| 258 | G22 | 15.05 | 47 | 0 | 2.25 | 9.5 | 13.2 | 0 | 12.5 | 0.5 | 0 | 0 |
| 259 | G22 | 12 | 0 | 30.6 | 3.55 | 15.85 | 23.5 | 0 | 14 | 0.5 | 0 | 0 |
| 260 | G22 | 8.5 | 0 | 33.55 | 3.75 | 16.55 | 24.05 | 0 | 13.5 | 0.1 | 0 | 0 |
| 261 | G22 | 11.35 | 0 | 33.25 | 3.95 | 18.25 | 25.7 | 0 | 7 | 0.5 | 0 | 0 |
| 262 | G22 | 8 | 0 | 34.05 | 3.75 | 16.55 | 24.05 | 0 | 13.5 | 0.1 | 0 | 0 |
| 263 | G22 | 14.25 | 0 | 46 | 2 | 9.65 | 13.45 | 0 | 14.55 | 0.1 | 0 | 0 |
| 264 | G22 | 13.5 | 0 | 44.75 | 2.1 | 9.75 | 13.5 | 0 | 16.3 | 0.1 | 0 | 0 |
| 265 | G22 | 12.5 | 36.9 | 0 | 2.35 | 10.5 | 24.25 | 0 | 13.5 | 0 | 0 | 0 |
| 266 | G22 | 11.25 | 0 | 30.8 | 3.75 | 16.55 | 24.05 | 0 | 13.5 | 0.1 | 0 | 0 |
| 267 | G22 | 10.4 | 0 | 15.75 | 5.5 | 24.65 | 34.25 | 0 | 9.35 | 0.1 | 0 | 0 |
| 268 | G22 | 12.75 | 0 | 46.5 | 2.25 | 9 | 13.25 | 0 | 16.15 | 0.1 | 0 | 0 |
| 269 | G22 | 12.95 | 0 | 45.7 | 2.25 | 9.5 | 13.3 | 0 | 15.8 | 0.5 | 0 | 0 |
| 270 | G22 | 10.5 | 28.8 | 0 | 4.15 | 19.25 | 27.2 | 0 | 10 | 0.1 | 0 | 0 |

TABLE 10

| Sample Number | First Ceramic Glass Number | (weight %) | Second Ceramic (weight %) | | | | | | MnO (weight %) | CuO (weight %) | Third Ceramic (weight %) | |
|---|---|---|---|---|---|---|---|---|---|---|---|---|
| | | | MgAl$_2$O$_4$ | Mg$_2$SiO$_4$ | BaO | TiO$_2$ | RE$_2$O$_3$ Nd$_2$O$_3$ | Sm$_2$O$_3$ | | | Mg$_2$Al$_4$Si$_5$O$_{18}$ | BaAl$_2$Si$_2$O$_8$ |
| 271 | G22 | 11.85 | 0 | 15.55 | 4.75 | 24.25 | 33.5 | 0 | 9.5 | 0.1 | 0 | 0 |
| 272 | G22 | 13 | 0 | 27.5 | 3.9 | 17.5 | 25.5 | 0 | 12.5 | 0.1 | 0 | 0 |
| 273 | G22 | 17.25 | 0 | 38 | 2.45 | 11.85 | 16.35 | 0 | 11.3 | 0.3 | 2.5 | 0 |
| 274 | G22 | 10.25 | 0 | 16.05 | 4.95 | 25.5 | 34.65 | 0 | 8.5 | 0.1 | 0 | 0 |
| 275 | G22 | 15 | 0 | 46.4 | 2.25 | 9.7 | 13.05 | 0 | 13.5 | 0.1 | 0 | 0 |
| 276 | G22 | 14.3 | 0 | 45.25 | 2.55 | 10.35 | 13.2 | 0 | 14.25 | 0.1 | 0 | 0 |
| 277 | G22 | 10.5 | 0 | 29.65 | 4.05 | 18.95 | 26.75 | 0 | 10 | 0.1 | 0 | 0 |
| 278 | G22 | 14.25 | 0 | 45.5 | 2.45 | 10.25 | 0 | 13.2 | 14.25 | 0.1 | 0 | 0 |
| 279 | G22 | 11.5 | 0 | 16.25 | 5 | 24.35 | 0 | 34.75 | 8.05 | 0.1 | 0 | 0 |
| 280 | G22 | 10.5 | 0 | 29.65 | 4.05 | 18.95 | 0 | 26.75 | 10 | 0.1 | 0 | 0 |
| 281 | G22 | 10 | 0 | 15.75 | 5.05 | 24.35 | 35.5 | 0 | 9.25 | 0.1 | 0 | 0 |
| 282 | G22 | 18.9 | 0 | 33.55 | 3.55 | 15.75 | 23.25 | 0 | 4.5 | 0.5 | 0 | 0 |
| 283 | G22 | 17.9 | 0 | 33.55 | 3.55 | 15.75 | 23.25 | 0 | 5.5 | 0.5 | 0 | 0 |
| 284 | G22 | 9.25 | 0 | 25.2 | 3.7 | 16.65 | 24.2 | 0 | 20.5 | 0.5 | 0 | 0 |
| 285 | G22 | 9.25 | 0 | 24.7 | 3.7 | 16.65 | 24.2 | 0 | 21 | 0.5 | 0 | 0 |
| 286 | G22 | 10 | 0 | 15.75 | 5.05 | 24.35 | 34.75 | 0 | 10 | 0.1 | 0 | 0 |
| 287 | G22 | 12 | 0 | 17.25 | 4.75 | 22.25 | 30.85 | 0 | 10.9 | 0.5 | 1.5 | 0 |
| 288 | G22 | 10.5 | 0 | 33.1 | 2.4 | 10.4 | 24.5 | 0 | 11.5 | 0.1 | 7.5 | 0 |
| 289 | G22 | 10.5 | 0 | 35.5 | 2.35 | 9.95 | 22.55 | 0 | 11.55 | 0.1 | 0 | 7.5 |
| 290 | G22 | 10.85 | 0 | 15.75 | 5.2 | 24.5 | 34.25 | 0 | 9.35 | 0.1 | 0 | 0 |
| 291 | G22 | 10.5 | 28.8 | 0 | 4.15 | 19.25 | 0 | 27.2 | 10 | 0.1 | 0 | 0 |
| 292 | G22 | 11.5 | 0 | 32 | 2.4 | 10.45 | 24 | 0 | 11.55 | 0.1 | 8 | 0 |
| 293 | G22 | 10.75 | 0 | 27.55 | 3.85 | 18.25 | 25.55 | 0 | 12.85 | 1.2 | 0 | 0 |
| 294 | G22 | 10.75 | 0 | 30 | 4.35 | 20.25 | 27.65 | 0 | 6.5 | 0.5 | 0 | 0 |
| 295 | G22 | 10.8 | 0 | 27.75 | 3.95 | 17.85 | 25.85 | 0 | 12.4 | 1.4 | 0 | 0 |

Thereafter, in the same manner as in the case of Experimental Example 1, samples were prepared, and evaluated for relative permittivity ($\epsilon_r$), Qf, temperature coefficient of capacitance (β), insulation reliability as shown in Tables 11 and 12. This experimental example was intended to obtain dielectric materials with relatively high $\epsilon_r$, such as $\epsilon_r$ in the range of 20 to 25. It is to be noted that, more strictly, the samples with β in excess of 60 ppm/K in terms of absolute value were determined as rejected articles. In the columns of "Insulation Reliability" of Tables 11 and 12, on the same test carried out as in the case of Experimental Example 1, the samples are shown as "x" when the log (IR [Ω]) after the test was less than 11, whereas the samples are shown as "o" when the log (IR [Ω]) is 11 or more.

It is to be noted that rejection reasons for the samples regarded as rejected articles in this experimental example are briefly described in the columns of "Remarks" of Tables 11 and 12.

TABLE 11

| Sample Number | εr | Qf (GHz) | β (ppm/K) | Insulation Reliability | Remarks |
|---|---|---|---|---|---|
| 201* | — | — | — | — | Unsintered |
| 202* | — | — | — | — | Unsintered |
| 203 | 20 | 8300 | 48 | ○ | |
| 204 | 23 | 9600 | 36 | ○ | |
| 205 | 24 | 9800 | 38 | ○ | |
| 206* | 24 | 9000 | 51 | X | decreased Insulation reliability |
| 207* | 23 | 8600 | 50 | X | decreased Insulation reliability |
| 208 | 23 | 8200 | 46 | ○ | |
| 209 | 23 | 7700 | 49 | ○ | |
| 210 | 22 | 8200 | 48 | ○ | |
| 211* | 22 | 4800 | 58 | ○ | decreased Qf |
| 212* | 23 | 4600 | 56 | ○ | decreased Qf |

TABLE 11-continued

| Sample Number | εr | Qf (GHz) | β (ppm/K) | Insulation Reliability | Remarks |
|---|---|---|---|---|---|
| 213 | 22 | 7700 | 46 | ○ | |
| 214 | 23 | 7600 | 45 | ○ | |
| 215 | 23 | 8900 | 41 | ○ | |
| 216 | 22 | 8800 | 40 | ○ | |
| 217 | 22 | 8700 | 48 | ○ | |
| 218* | — | — | — | — | Unsintered |
| 219 | 22 | 9400 | 42 | ○ | |
| 220* | — | — | — | — | Unsintered |
| 221 | 22 | 9400 | 39 | ○ | |
| 222* | — | — | — | — | Unsintered |
| 223 | 22 | 9300 | 40 | ○ | |
| 224* | 23 | 8100 | 44 | X | decreased Insulation reliability |
| 225 | 23 | 9700 | 40 | ○ | |
| 226 | 22 | 9500 | 39 | ○ | |
| 227 | 23 | 10600 | 35 | ○ | |
| 228 | 22 | 10200 | 42 | ○ | |
| 229 | 22 | 9700 | 38 | ○ | |
| 230 | 23 | 9200 | 36 | ○ | |
| 231 | 22 | 9500 | 39 | ○ | |
| 232 | 24 | 7700 | 42 | ○ | |
| 233 | 23 | 8600 | 40 | ○ | |
| 234 | 24 | 8800 | 52 | ○ | |
| 235 | 20 | 7300 | 50 | ○ | |
| 236 | 22 | 8400 | 46 | ○ | |
| 237 | 23 | 9900 | 36 | ○ | |
| 238 | 21 | 7600 | 50 | ○ | |
| 239* | 20 | 7400 | 86 | ○ | degraded β |
| 240* | 20 | 7200 | 88 | ○ | degraded β |
| 241* | 21 | 9200 | 54 | X | decreased Insulation reliability |
| 242* | 22 | 8900 | 56 | X | decreased Insulation reliability |
| 243* | — | — | — | — | Unvitrified |
| 244* | — | — | — | — | Unvitrified |
| 245* | 21 | 6000 | 52 | X | decreased |

TABLE 11-continued

| Sample Number | εr | Qf (GHz) | β (ppm/K) | Insulation Reliability | Remarks |
|---|---|---|---|---|---|
| 246* | 22 | 6200 | 55 | X | Insulation reliability decreased |
| 267* | 22 | 6100 | 58 | X | Insulation reliability decreased |
| 248* | 20 | 6200 | 55 | X | Insulation reliability decreased |

TABLE 12

| Sample Number | εr | Qf (GHz) | β (ppm/K) | Insulation Reliability | Remarks |
|---|---|---|---|---|---|
| 249* | — | — | — | — | Unsintered |
| 250 | 21 | 8200 | 53 | ○ | |
| 251 | 22 | 8600 | 48 | ○ | |
| 252* | 22 | 7800 | 48 | X | decreased Insulation reliability |
| 253* | 25 | 5500 | 50 | ○ | decreased Qf |
| 254 | 25 | 8200 | 42 | ○ | |
| 255 | 21 | 9000 | 54 | ○ | |
| 256* | 21 | 8300 | 74 | ○ | degraded β |
| 257 | 24 | 7900 | 50 | ○ | |
| 258 | 22 | 9000 | 55 | ○ | |
| 259 | 23 | 9600 | 42 | ○ | |
| 260 | 21 | 9100 | 44 | ○ | |
| 261 | 23 | 9600 | 39 | ○ | |
| 262 | 21 | 9200 | 40 | ○ | |
| 263* | 16 | 7700 | 55 | ○ | decreased $\epsilon_r$ |
| 264 | 20 | 8100 | 52 | ○ | |
| 265 | 23 | 9600 | 47 | ○ | |
| 266 | 23 | 9800 | 45 | ○ | |
| 267* | 24 | 7800 | 50 | X | decreased Insulation reliability |
| 268* | 18 | 7900 | 46 | ○ | decreased $\epsilon_r$ |
| 269 | 20 | 8400 | 46 | ○ | |
| 270 | 22 | 8000 | 46 | ○ | |
| 271 | 23 | 9400 | 48 | ○ | |
| 272 | 24 | 9300 | 48 | ○ | |
| 273 | 24 | 7700 | 48 | ○ | |
| 274* | 23 | 8100 | 50 | X | decreased Insulation reliability |
| 275* | 18 | 8000 | 55 | ○ | decreased $\epsilon_r$ |
| 276 | 20 | 9400 | 48 | ○ | |
| 277 | 24 | 10300 | 38 | ○ | |
| 278 | 21 | 9400 | 46 | ○ | |
| 279 | 23 | 9700 | 42 | ○ | |
| 280 | 23 | 9900 | 43 | ○ | |
| 281* | 23 | 9000 | 44 | X | decreased Insulation reliability |
| 282* | — | — | — | — | Unsintered |
| 283 | 20 | 9400 | 52 | ○ | |
| 284 | 22 | 8900 | 55 | ○ | |
| 285* | 22 | 4000 | 58 | ○ | decreased Qf |
| 286 | 24 | 8900 | 46 | ○ | |
| 287 | 22 | 8700 | 44 | ○ | |
| 288 | 21 | 8000 | 52 | ○ | |
| 289 | 21 | 7900 | 53 | ○ | |
| 290 | 20 | 9600 | 55 | ○ | |
| 291 | 23 | 9000 | 46 | ○ | |
| 292* | 21 | 8000 | 68 | ○ | degraded β |
| 293 | 22 | 8400 | 50 | ○ | |
| 294 | 24 | 9300 | 40 | ○ | |
| 295* | 22 | 4500 | 50 | ○ | decreased Qf |

In Tables 11 and 12, the sample numbers are marked with * for the samples determined as rejected articles in this experimental example.

The following is determined from Tables 8 through 12.

First, the samples 201 to 248 shown in Tables 8 and 11 will be considered.

For the samples 201 to 248, the glass G1 to G36 shown in Table 1 was all used for any of the samples. It is to be noted that the content of the "Glass" was adjusted to any of "11.1 weight %" and "11.5 weight %" for the samples 201 to 248.

The samples 201 and 202 were not sufficiently sintered. This is assumed to be due to the use of the glass G1 with the $Li_2O$ content lower than 0.3 weight %.

The samples 206 and 207 underwent a decrease in insulation reliability. This is assumed to be due to the use of the glass G5 with the $Li_2O$ content higher than 7.5 weight %.

The samples 211 and 212 underwent a decrease in Qf. This is assumed to be due to the use of the glass G8 with the alkali-earth metal content lower than 44.0 weight %.

The sample 218 was not sufficiently sintered. This is assumed to be due to the use of the glass G13 with the alkali-earth metal content higher than 69.0 weight %.

The sample 220 was not sufficiently sintered. This is assumed to be due to the use of the glass G15 with the $B_2O_3$ content lower than 10.0 weight %.

The sample 222 was not sufficiently sintered. This is assumed to be due to the use of the glass G17 with the $SiO_2$ content higher than 30.0 weight %.

The sample 224 underwent a decrease in insulation reliability. This is assumed to be due to the use of the glass G19 with the $B_2O_3$ content higher than 20.0 weight %.

The sample 239 and 240 underwent a degradation in temperature coefficient of capacitance β. This is assumed to be due to the use of the glass G32 with the MgO content lower than 0.1 weight %.

The samples 241 and 242 underwent a decrease in insulation reliability. This is assumed to be due to the use of the glass G33 with the MgO content higher than 5.5 weight %.

The samples 243 and 244 were not vitrified. This is assumed to be due to the use of the glass G34 with the $SiO_2$ content lower than 14.2 weight %.

The samples 245 and 246 underwent a decrease in insulation reliability. This is assumed to be due to the use of the glass G35 with the $Al_2O_3$ content lower than 0.5 weight %.

The samples 247 and 248 underwent a decrease in insulation reliability. This is assumed to be due to the use of the glass G36 with the $Al_2O_3$ content higher than 4.0 weight %.

The samples 203 to 205, 208 to 210, 213 to 217, 219, 221, 223, and 225 to 238 shown in Tables 8 and 11, except for the samples 201, 202, 206, 207, 211, 212, 218, 220, 222, 224, and 239 to 248 mentioned above produced favorable results of: $\epsilon_r$ in the range of 20 to 25; Qf of 7000 GHz or more, β of 60 ppm/K or less in terms of absolute value; and log (IR [Ω]):11 or more in insulation reliability.

This is assumed to be due to the use of any glass from among G2, G3, G4, G6, G7, G9, G10, G11, G12, G14, G16, G18, G20, G21, G22, G23, G24, G25, G26, G27, G28, G29, G30, and G31 which meet the conditions of: the alkali-earth metal content from 44.0 to 69.0 weight %; the $SiO_2$ content from 14.2 to 30.0 weight %; the $B_2O_3$ content from 10.0 to 20.0 weight %; the $Al_2O_3$ content from 0.5 to 4.0 weight %; the $Li_2O$ content from 0.3 to 7.5 weight %; and the MgO content from 0.1 to 5.5 weight %.

Next, the samples 249 to 295 shown in Tables 9 and 10 and Table 12 will be considered. For the samples 249 to 295, the respective contents of the "Glass", "First Ceramic", "Second Ceramic", "MnO", "CuO", "Mg$_2$Al$_4$Si$_5$O$_{18}$", and "BaAl$_2$Si$_2$O$_8$" were varied while using the glass G22 shown as the "Glass" in Table 1.

The sample 249 was not sufficiently sintered. This is assumed to be due to the glass content lower than 7 weight %.

The sample 252 underwent a decrease in insulation reliability. This is assumed to be due to the glass content higher than 20 weight %.

The sample 253 underwent a decrease in Qf. This is assumed to be due to the MgAl$_2$O$_4$ or Mg$_2$SiO$_4$ content lower than 15.5 weight % as the first ceramic.

The sample 256 underwent a degradation in temperature coefficient of capacitance β. This is assumed to be due to the MgAl$_2$O$_4$ or Mg$_2$SiO$_4$ content higher than 47 weight % as the first ceramic.

The sample 263 was less than 20 in $\epsilon_r$. This is assumed to be due to the BaO content lower than 2.1 weight % in the second ceramic.

The sample 267 underwent a decrease in insulation reliability. This is assumed to be due to the BaO content higher than 5.2 weight % in the second ceramic.

The sample 268 was less than 20 in $\epsilon_r$. This is assumed to be due to the TiO$_2$ content lower than 9.5 weight % in the second ceramic.

The sample 274 underwent a decrease in insulation reliability. This is assumed to be due to the TiO$_2$ content higher than 24.75 weight % in the second ceramic.

The sample 275 was less than 20 in $\epsilon_r$. This is assumed to be due to the Nd$_2$O$_3$ content lower than 13.2 weight % as RE$_2$O$_3$ in the second ceramic.

The sample 281 underwent a decrease in insulation reliability. This is assumed to be due to the Nd$_2$O$_3$ content higher than 34.75 weight % as RE$_2$O$_3$ in the second ceramic.

The sample 282 was not sufficiently sintered. This is assumed to be due to the MnO content lower than 5.5 weight %.

The sample 285 underwent a decrease in Qf. This is assumed to be due to the MnO content higher than 20.5 weight %.

The sample 292 underwent a degradation in temperature coefficient of capacitance β. This is assumed to be due to the third ceramic content higher than 7.5 weight %, which is composed of at least one of Mg$_2$Al$_4$Si$_5$O$_{18}$ and BaAl$_2$Si$_2$O$_8$.

The sample 295 underwent a decrease in Qf. This is assumed to be due to the CuO content higher than 1.2 weight %.

The samples 250, 251, 254, 255, 257 to 262, 264 to 266, 269 to 273, 276 to 280, 283, 284, 286 to 291, 293, and 294 shown in Tables 9 and 10 and Table 12, except for the samples 249, 252, 253, 256, 263, 267, 268, 274, 275, 281, 282, 285, 292, and 295 mentioned above, have achieved favorable results such as: Qf of 7000 GHz or more, β of 60 ppm/K or less in terms of absolute value; and insulation reliability of 11 or more in log (IR [Ω]), in spite of $\epsilon_r$ in the range of 20 to 25.

This is assumed to be due to the fact that the samples meet the conditions of: the first ceramic content from 15.5 to 47 weight %; the glass content from 7 to 20 weight %; the MnO content from 5.5 to 20.5 weight %; the BaO content from 2.1 to 5.2 weight %; the RE$_2$O$_3$ content from 13.2 to 34.75 weight %; the TiO$_2$ content from 9.5 to 24.75 weight %; the CuO content of 1.2 weight % or less, as well as the third ceramic content of 7.5 weight % or less, which is composed of at least one of Mg$_2$Al$_4$Si$_5$O$_{18}$ and BaAl$_2$Si$_2$O$_8$.

It is to be noted that while Nd$_2$O$_3$ and Sm$_2$O$_3$ were used as the RE$_2$O$_3$ in the second ceramic in Experimental Example 3, it has been confirmed that the same tendency is shown even in the case of using other rare-earth elements.

Experimental Example 4

Figure 6A:
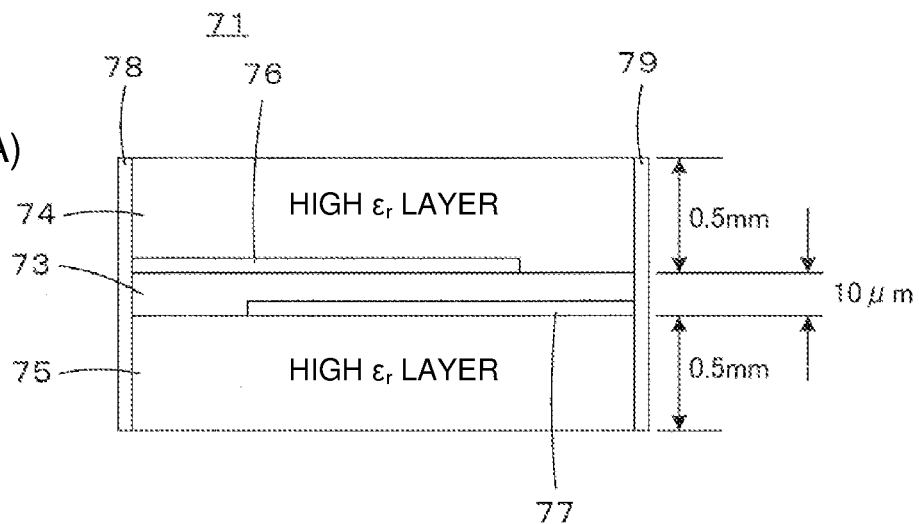
FIGS. 6(A) and 6(B) are cross-sectional views illustrating two types of co-sintered bodies prepared in experimental examples.
Figure 6B:
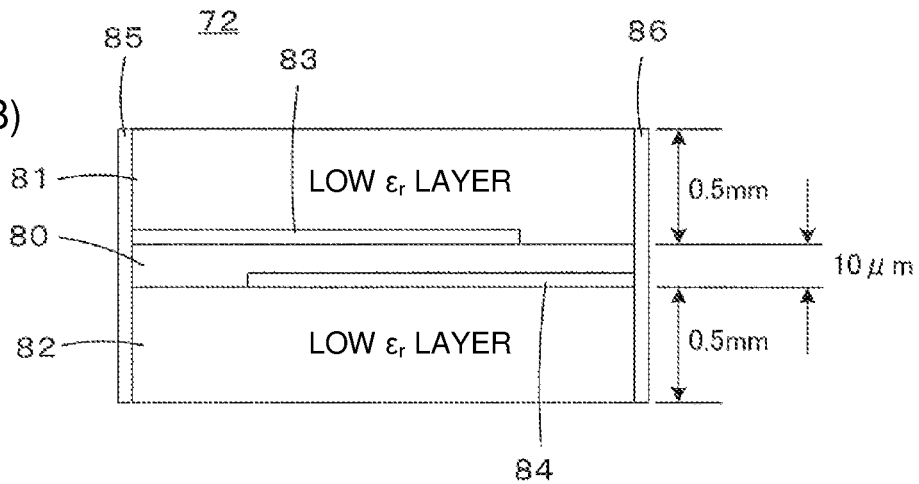

In Experimental Example 4, for each of low dielectric-constant ceramic layers and high dielectric-constant ceramic layers, the influence on characteristics, in particular, the influence on the relative permittivity $\epsilon_r$ and temperature coefficient of capacitance β was examined in the case of a co-sintered body of the layers. FIGS. 6(A) and 6(B) respectively show, in cross section, two types of co-sintered bodies 71 and 72 prepared in this experimental example.

The co-sintered body 71 shown in FIG. 6(A) was structured to have a low dielectric-constant ceramic layer 73 of 10 μm in thickness sandwiched between two high dielectric-constant ceramic layers 74 and 75 of 0.5 mm in thickness. Internal electrodes 76 and 77 were respectively formed so as to be partially opposed to each other between the low dielectric-constant ceramic layer 73 and each of the high dielectric-constant ceramic layers 74 and 75, and external electrodes 78 and 79 electrically connected to the internal electrodes 76 and 77 respectively were formed on mutually opposed end surfaces.

The co-sintered body 72 shown in FIG. 6(B), reverse from the co-sintered body 71 shown in FIG. 6(A) in terms of positional relationship between the low dielectric-constant ceramic layer and the high dielectric-constant ceramic layers, was structured to have a high dielectric-constant ceramic layer 80 of 10 μm in thickness sandwiched between two low dielectric-constant ceramic layers 81 and 82 of 0.5 mm in thickness. Internal electrodes 83 and 84 were respectively formed so as to be partially opposed to each other between the high dielectric-constant ceramic layer 80 and each of the low dielectric-constant ceramic layers 81 and 82, and external electrodes 85 and 86 electrically connected to the internal electrodes 83 and 84 respectively were formed on mutually opposed end surfaces. The distance between the internal electrodes was 10 μm, and the electrode area was 4 mm×4 mm.

The co-sintered bodies 71 and 72 were adjusted to 10 mm×10 mm in planar dimension. In addition, the internal electrodes 76, 77, 83, and 84 as well as the external electrodes 78, 79, 85, and 86 were formed by printing a conductive paste containing Cu as a conductive component.

The co-sintered body 71 shown in FIG. 6(A) was used in the case of evaluating the characteristics of co-sintered bodies with the low dielectric-constant glass ceramic prepared in Experimental Examples 1 and 2 described previously, whereas the co-sintered body 72 shown in FIG. 6(B) was used in the case of evaluating the characteristics of co-sintered bodies with the high dielectric-constant glass ceramic prepared in Experimental Example 3.

For each of the low dielectric-constant ceramic layer 73 in the co-sintered body 71 and the high dielectric-constant ceramic layer 80 in the co-sintered body 72, the determination of the relative permittivity $\epsilon_r$ and temperature coefficient of capacitance β achieved results equivalent to those in each case of the low dielectric-constant glass ceramic alone and high dielectric-constant glass ceramic alone.

More specifically, the relative permittivity $\epsilon_r$ was obtained from the following formula with the electrostatic capacitance value at 1 MHz, which was measured with an LCR meter, as well as the area and distance of the opposed electrodes.

$$\epsilon_r = (d \times Cap)/(\epsilon_0 \times S)$$

where d represents an interelectrode distance [m], S represents an opposed electrode area [m$^2$], Cap represents electrostatic capacitance [F], and $\epsilon_0$ represents a dielectric constant (8.854×10$^{-12}$ [F/]) in vacuum.

In addition, the temperature coefficient of capacitance β was obtained by the same method as in the case of Experimental Example 1.

It is to be noted that, although no particular evaluation was made on the Qf, the Qf is also assumed to be equivalent to that in the case the glass ceramic alone, due to the fact that the relative permittivity $\epsilon_r$ and temperature coefficient of capacitance β are equivalent as described above.

Experimental Example 5

In Experimental Example 5, experiments were conducted to examine, in a co-sintered body of a low dielectric-constant ceramic layer and a high dielectric-constant ceramic layer, whether there are preferred ranges for the ratio of $G_L/G_H$ between the content $G_L$ of glass contained in the low dielectric-constant ceramic layer and the content $G_H$ of glass contained in the high dielectric-constant ceramic layer, as well as the ratio of $M_L/M_H$ between the content $M_L$ of MnO contained in the low dielectric-constant ceramic layer and the content $M_H$ of MnO contained in the high dielectric-constant ceramic layer, and if any, which ranges are preferred.

In order to obtain samples with the ratios $G_L/G_H$ and $M_L/M_H$ varied variously, the low dielectric-constant glass ceramics shown in Table 3 with the sample numbers shown in the column "Sample Number for Low Dielectric-Constant Layer" of Table 13 were combined with the high dielectric-constant glass ceramics shown in Table 9 or 10 with the sample numbers shown in the column "High Dielectric-Constant Sample Number" of Table 13 to prepare the co-sintered bodies 71 and 72 as respectively shown in FIGS. 6(A) and 6(B).

In the respective columns "$G_L/G_H$" and "$M_L/M_H$" of Table 13, the ratio $G_L/G_H$ and the $M_L/M_H$ are each shown for the combined low dielectric-constant glass ceramic and high dielectric-constant glass ceramic.

In this experimental example, the co-sintered body 71 shown in FIG. 6(A) was used to evaluate the low dielectric-constant glass ceramic for insulation reliability, and the co-sintered body 72 shown in FIG. 6(B) was used to evaluate the high dielectric-constant glass ceramic for insulation reliability.

For the evaluation of the insulation reliability, a test was carried out in which respective voltages of DC 200 V, 100 V, and 50 V were applied for 100 hours under a temperature of 150° C. between the external electrodes 78 and 79 of the co-sintered body 71 or between the external electrodes 85 and 86 of the co-sintered body 72. The insulation resistance was measured after the test, and the samples were determined as rejected articles when the log (IR [Ω]) after this test was less than 11.

The insulation reliability of the low dielectric-constant ceramic layer side is shown in the column "Reliability of Low Dielectric Constant Side" of Table 13, whereas the insulation reliability of the high dielectric-constant ceramic layer side is shown in the column "Reliability of High Dielectric Constant Side" thereof, where the sample is shown as "⊙" when the insulation resistance was not degraded even at the applied voltage of 200 V, shown as "o" when the insulation resistance was degraded at 200 V, but not degraded at 100 V, or shown as "Δ" when the insulation resistance was degraded at 200 V and 100 V, but not degraded at 50 V.

TABLE 13

| Sample Number | Sample Number for Low Dielectric Constant Layer | Sample Number for High Dielectric Constant Layer | $G_L/G_H$ | $M_L/M_H$ | Reliability of Low Dielectric Constant Side | Reliability of High Dielectric Constant Side |
|---|---|---|---|---|---|---|
| 301 | 64 | 261 | 0.53 | 2.14 | Δ | Δ |
| 302 | 60 | 264 | 0.74 | 0.61 | ○ | Δ |
| 303 | 55 | 284 | 1.30 | 0.49 | ○ | Δ |
| 304 | 62 | 261 | 1.76 | 2.57 | ○ | Δ |
| 305 | 62 | 294 | 1.86 | 2.77 | Δ | Δ |
| 306 | 65 | 250 | 2.00 | 0.57 | Δ | Δ |
| 307 | 71 | 262 | 1.94 | 0.70 | Δ | ○ |
| 308 | 51 | 251 | 0.60 | 1.42 | Δ | ○ |
| 309 | 81 | 251 | 0.58 | 1.95 | Δ | ○ |
| 310 | 51 | 283 | 0.67 | 2.45 | Δ | Δ |
| 311 | 53 | 272 | 1.15 | 0.96 | ⊙ | ⊙ |
| 312 | 56 | 272 | 0.92 | 0.96 | ⊙ | ⊙ |
| 313 | 59 | 272 | 1.00 | 1.20 | ⊙ | ⊙ |
| 314 | 53 | 277 | 1.43 | 1.20 | ⊙ | ⊙ |
| 315 | 56 | 277 | 1.14 | 1.20 | ⊙ | ⊙ |
| 316 | 59 | 277 | 1.24 | 1.50 | ⊙ | ⊙ |

In Table 13, first, when attention is focused on the "$G_L/G_H$", the samples 302 to 304 and 311 to 316 which meet the condition of $0.74 \leq G_L/G_H \leq 1.76$ have the evaluation of "o" or "⊙" achieved in regard to, in particular, "Reliability of Low Dielectric Constant Side".

Next, when attention is focused on the "$M_L/M_H$", the samples 307 to 309 and 311 to 316 which meet the condition of $0.7 \leq M_L/M_H \leq 1.95$ have the evaluation of "o" or "⊙" achieved in regard to, in particular, "Reliability of High Dielectric Constant Side".

Experimental Example 6

In Experimental Example 6, the influences of the ratio $G_L/G_H$ between the glass contents and of the ratio $M_L/M_H$ between the MnO contents in a co-sintered body on the insulation reliability were examined as in the case of Experimental Example 5, and the warpage inhibiting effect was examined in the case of the low dielectric-constant ceramic layer further containing a third ceramic including at least one of $Mg_2Al_4Si_5O_{18}$ and $BaAl_2Si_2O_8$.

In this Experimental Example 6, in order to obtain samples with the ratio $G_L/G_H$ and ratio $M_L/M_H$ varied variously, the low dielectric-constant glass ceramics shown in Table 6 with the sample numbers shown in the column "Sample Number for Low Dielectric-Constant Layer" of Table 14 were combined with the high dielectric-constant glass ceramics shown in Table 9 or 10 with the sample numbers shown in the column "High Dielectric-Constant Sample Number" of Table 14 to prepare the co-sintered bodies 71 and 72 as respectively shown in FIGS. 6(A) and 6(B).

Next, in the same manner as in the case of Experimental Example 5, the "Reliability of Low Dielectric Constant Side" and "Reliability of High Dielectric Constant Side" were evaluated as shown in Table 14.

In this Experimental Example 6, furthermore, "Warpage" was evaluated as shown in Table 14.

As for the "Warpage", a composite substrate of 50 mm×50 mm in planar dimension and 1 mm in thickness was prepared by stacking a low dielectric-constant ceramic layer of 0.5 mm in thickness and a high dielectric-constant ceramic layer of 0.5 mm in thickness, and placed on a surface plate to measure the level of the highest point, and the value obtained by subtracting the thickness of the composite substrate from the level was determined as a warpage amount. The samples with a warpage amount of 0.1 mm or less were determined as accepted articles, and are shown as "0" in the column "Warpage" of Table 14, whereas the samples with the warpage amount in excess of 0.1 mm were determined as rejected articles, and are shown as "x" in the same column.

Next, as for the "Warpage", the samples 402, 404 to 406, 409 to 411, and 413 have the evaluation of "⊙" achieved, which use the low dielectric-constant glass ceramics according to the samples 102, 104 to 106, 109 to 111, and 113 further containing 3 to 20 weight % of the third ceramic including at least one of $Mg_2Al_2Si_5O_{15}$ and $BaAl_2Si_2O_8$ in the "Low Dielectric-Constant Layer".

Experimental Example 7

In Experimental Example 7, the influences of the ratio $G_L/G_H$ between the glass contents and of the ratio $M_L/M_H$ between the MnO contents in a co-sintered body on the insulation reliability were examined as in the case of Experimental Example 6, and the warpage inhibiting effect was examined in the case of the low dielectric-constant ceramic layer further containing a third ceramic including at least one of $Mg_2Al_4Si_5O_{18}$ and $BaAl_2Si_2O_8$.

Furthermore, in the experimental example, the influences of the difference $(C_L-C_H)$ between the content $C_L$ of the third ceramic contained in the low dielectric-constant ceramic layer and the content $C_H$ of the third ceramic contained in the high dielectric-constant ceramic layer on insulation reliabil-

TABLE 14

| Sample Number | Sample Number for Low Dielectric Constant Layer | Sample Number for High Dielectric Constant Layer | $G_L/G_H$ | $M_L/M_H$ | Reliability of Low Dielectric Constant Side | Reliability of High Dielectric Constant Side | Warpage |
|---|---|---|---|---|---|---|---|
| 401 | 101 | 277 | 1.24 | 1.43 | ⊙ | ⊙ | X |
| 402 | 102 | 277 | 1.24 | 1.43 | ○ | ○ | ○ |
| 403 | 103 | 259 | 1.08 | 1.07 | ○ | ○ | X |
| 404 | 104 | 260 | 1.53 | 1.11 | ○ | ○ | ○ |
| 405 | 105 | 266 | 1.16 | 1.11 | ○ | ○ | ○ |
| 406 | 106 | 272 | 1.00 | 1.20 | ○ | ○ | ○ |
| 407 | 107 | 287 | 1.08 | 1.38 | ○ | ○ | X |
| 408 | 108 | 259 | 1.08 | 1.07 | ○ | ○ | X |
| 409 | 109 | 260 | 1.53 | 1.11 | ○ | ○ | ○ |
| 410 | 110 | 266 | 1.16 | 1.11 | ○ | ○ | ○ |
| 411 | 111 | 272 | 1.00 | 1.20 | ○ | ○ | ○ |
| 412 | 112 | 287 | 1.08 | 1.38 | ○ | ○ | X |
| 413 | 113 | 277 | 1.24 | 1.50 | ○ | ○ | ○ |

In regard to the "Reliability of Low Dielectric Constant Side" and "Reliability of High Dielectric Constant Side" in Table 14, a tendency is indicated which is similar to that in the case of Experimental Example 5.

More specifically, in Table 14, first, when attention is focused on the "$G_L/G_H$", the samples 401 to 413 all meet the condition of $0.74 \le G_L/G_H \le 1.76$, and have the evaluation of "o" or "⊙" achieved in regard to the "Reliability of Low Dielectric Constant Side".

Next, when attention is focused on the "$M_L/M_H$", the samples 401 to 413 all meet the condition of $0.7 \le M_L/M_H \le 1.95$, and have the evaluation of "○" or "⊙" achieved in regard to "Reliability of High Dielectric Constant Side".

Furthermore, the samples 506 to 511 which meet both of the conditions $1.0 \le G_L/G_H \le 2.0$ and $1.5 \le M_L/M_H \le 3.6$ have the evaluation of "⊙" achieved in regard to both "Reliability of Low Dielectric Constant Side" and "Reliability of High Dielectric Constant Side".

ity and warpage were examined in the case of the high dielectric-constant ceramic layer containing the third ceramic.

In this Experimental Example 7, in order to obtain samples with the ratio $G_L/G_H$ and ratio $M_L/M_H$ as well as difference $(C_L-C_H)$ varied variously, the low dielectric-constant glass ceramics shown in Table 6 with the sample numbers shown in the column "Sample Number for Low Dielectric-Constant Layer" of Table 15 were combined with the high dielectric-constant glass ceramics shown in Table 10 with the sample numbers shown in the column "High Dielectric-Constant Sample Number" of Table 15 to prepare the co-sintered bodies 71 and 72 respectively as shown in FIGS. 6(A) and 6(B).

Next, in the same manner as in the case of Experimental Example 5, the "Reliability of Low Dielectric Constant Side" and "Reliability of High Dielectric Constant Side" were evaluated as shown in Table 15.

In addition, in the same manner as in the case of Experimental Example 6, "Warpage" was evaluated as shown in Table 15.

TABLE 15

| Sample Number | Sample Number for Low Dielectric Constant Layer | Sample Number for High Dielectric Constant Layer | $C_L - C_H$ (weight %) | $G_L/G_H$ | $M_L/M_H$ | Reliability of Low Dielectric Constant Side | Reliability of High Dielectric Constant Side | Warpage |
|---|---|---|---|---|---|---|---|---|
| 501 | 104 | 287 | 1.5 | 1.08 | 1.38 | ☉ | ☉ | X |
| 502 | 104 | 289 | −4.5 | 1.24 | 1.30 | ☉ | ☉ | X |
| 503 | 109 | 287 | 1.5 | 1.08 | 1.38 | ☉ | ☉ | X |
| 504 | 109 | 289 | −4.5 | 1.24 | 1.30 | ☉ | ☉ | X |
| 505 | 105 | 273 | 7.5 | 0.75 | 1.33 | ☉ | ☉ | ○ |
| 506 | 105 | 288 | 2.5 | 1.24 | 1.30 | ☉ | ☉ | ○ |
| 507 | 105 | 289 | 2.5 | 1.24 | 1.30 | ☉ | ☉ | ○ |
| 508 | 110 | 287 | 8.5 | 1.08 | 1.38 | ☉ | ☉ | ○ |
| 509 | 110 | 288 | 2.5 | 1.24 | 1.30 | ☉ | ☉ | ○ |
| 510 | 110 | 289 | 2.5 | 1.24 | 1.30 | ☉ | ☉ | ○ |
| 511 | 106 | 289 | 12.5 | 1.24 | 1.30 | ☉ | ☉ | ○ |
| 512 | 111 | 287 | 18.5 | 1.08 | 1.38 | ☉ | ☉ | ○ |
| 513 | 111 | 289 | 12.5 | 1.24 | 1.30 | ☉ | ☉ | ○ |

In Table 15, the samples 501 to 513 all meet both of the conditions $0.74 \leq G_L/G_H \leq 1.76$ and $1.5 \leq M_L/M_H \leq 3.6$, and have the evaluation of "☉" achieved in regard to both "Reliability of Low Dielectric Constant Side" and "Reliability of High Dielectric Constant Side".

In this regard, the samples 273, 287, 288, and 289 shown in the column of "Sample Number for High Dielectric Constant Layer", for use in the samples 501 to 513 were each adapted to contain the third ceramic in the range of 1 to 7.5 weight %.

Next, when attention is focused on the "$C_L - C_H$", the difference is 2.5 weight % or more in the samples 505 to 513. As a result, the samples 505 to 513 have the evaluation of "○" in regard to "Warpage". On the other hand, the samples 501 to 504 with the "$C_L - C_H$" less than 2.5 weight % have the evaluation of "x" made in regard to "Warpage".

DESCRIPTION OF REFERENCE SYMBOLS

1 ceramic multilayer module
2 multilayer ceramic substrate
3, 73, 81, 82 low dielectric-constant ceramic layer
4, 74, 75, 80 high dielectric-constant ceramic layer
21 LC filter
23 component body
28 to 32, 35 to 40 low dielectric-constant ceramic layer
33, 34 high dielectric-constant ceramic layer
71, 72 co-sintered body

The invention claimed is:

1. A composite laminated ceramic electronic component comprising:
a first dielectric-constant ceramic layer and a second dielectric-constant ceramic layer that are stacked, the first dielectric-constant ceramic layer having a lower dielectric constant than the second dielectric-constant ceramic layer, wherein
the first dielectric-constant ceramic layer and the second dielectric-constant ceramic layer each comprises:
a glass ceramic containing:
(1) a first ceramic comprising at least one of $MgAl_2O_4$ and $Mg_2SiO_4$;
(2) a second ceramic including BaO, $RE_2O_3$, and $TiO_2$;
(3) glass containing each of 44.0 to 69.0 weight % of RO, 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and
(4) MnO,
wherein RE is a rare-earth element,
wherein R is at least one alkali-earth metal selected from Ba, Ca, and Sr,
wherein the first dielectric-constant ceramic layer:
contains 47.55 to 69.32 weight % of the first ceramic;
contains 6 to 20 weight % of the glass;
contains 7.5 to 18.5 weight % of the MnO;
contains, as the second ceramic, each of 0.38 to 1.43 weight % of BaO, 1.33 to 9.5 weight % of $RE_2O_3$, and 0.95 to 6.75 weight % of $TiO_2$; and
has a relative permittivity of 15 or less, and wherein the second dielectric-constant ceramic layer:
contains 15.5 to 47 weight % of the first ceramic;
contains 7 to 20 weight % of the glass;
contains 5.5 to 20.5 weight % of the MnO;
contains, as the second ceramic, each of 2.1 to 5.2 weight % of BaO, 13.2 to 34.75 weight % of $RE_2O_3$; and 9.5 to 24.75 weight % of $TiO_2$; and
has a relative permittivity of 20 or more and 25 or less.

2. The composite laminated ceramic electronic component according to claim 1, wherein a content $G_L$ of the glass contained in the first dielectric-constant ceramic layer and a content $G_H$ of the glass contained in the second dielectric-constant ceramic layer meet a condition of $0.74 \leq G_L/G_H \leq 1.76$.

3. The composite laminated ceramic electronic component according to claim 1, wherein a content $M_L$ of the MnO contained in the first dielectric-constant ceramic layer and a content $M_H$ of the MnO contained in the second dielectric-constant ceramic layer meet a condition of $0.7 \leq G_L/G_H \leq 1.95$.

4. The composite laminated ceramic electronic component according to claim 1,
wherein a content $G_L$ of the glass contained in the first dielectric-constant ceramic layer and a content $G_H$ of the glass contained in the second dielectric-constant ceramic layer meet a condition of $0.74 \leq G_L/G_H \leq 1.76$, and
a content $M_L$ of the MnO contained in the first dielectric-constant ceramic layer and a content $M_H$ of the MnO contained in the second dielectric-constant ceramic layer meet a condition of $0.7 \leq M_L/M_H \leq 1.95$.

5. The composite laminated ceramic electronic component according to claim 1, wherein the first dielectric-constant ceramic layer further contains 3 to 20 weight % of a third ceramic including at least one of $Mg_2Al_4Si_5O_{18}$ and $BaAl_2Si_2O_8$.

6. The composite laminated ceramic electronic component according to according to claim 5, wherein the second dielectric-constant ceramic layer contains 1 to 7.5 weight % of the third ceramic, and a difference between a content $C_L$ of the third ceramic contained in the first dielectric-constant ceramic layer and a content $C_H$ of the third ceramic contained in the second dielectric-constant ceramic layer is 2.5 weight % or more.

7. The composite laminated ceramic electronic component according to claim 1, wherein the first dielectric-constant ceramic layer further contains 0.23 weight % or less of CuO.

8. The composite laminated ceramic electronic component according to claim 7, wherein the second dielectric-constant ceramic layer further contains 1.2 weight % or less of CuO.

9. The composite laminated ceramic electronic component according to claim 1, wherein the second dielectric-constant ceramic layer further contains 1.2 weight % or less of CuO.

10. The composite laminated ceramic electronic component according to claim 1, wherein the first dielectric-constant ceramic layer has a temperature coefficient of capacitance of 150 ppm/K or less.

11. The composite laminated ceramic electronic component according to claim 10, wherein the second dielectric-constant ceramic layer has a temperature coefficient of capacitance of 60 ppm/K or less.

12. The composite laminated ceramic electronic component according to claim 1, wherein the second dielectric-constant ceramic layer has a temperature coefficient of capacitance of 60 ppm/K or less.

\* \* \* \* \*